United States Patent
Stahr et al.

(10) Patent No.: US 10,765,005 B2
(45) Date of Patent: Sep. 1, 2020

(54) EMBEDDING COMPONENT WITH PRE-CONNECTED PILLAR IN COMPONENT CARRIER

(71) Applicant: AT&S Austria Technologie & Systemtechnik Aktiengesellschaft, Leoben (AT)

(72) Inventors: Hannes Stahr, Gassing (AT); Hannes Voraberger, Graz (AT); Andreas Zluc, Leoben (AT); Bettina Schuster, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/169,741

(22) Filed: Oct. 24, 2018

(65) Prior Publication Data
US 2019/0124772 A1   Apr. 25, 2019

(30) Foreign Application Priority Data

Oct. 25, 2017 (EP) .................................. 17198423

(51) Int. Cl.
| | |
|---|---|
| *H05K 1/18* | (2006.01) |
| *H05K 1/11* | (2006.01) |
| *H05K 3/34* | (2006.01) |
| *H05K 3/40* | (2006.01) |
| *H01L 23/00* | (2006.01) |

(Continued)

(52) U.S. Cl.
CPC ......... *H05K 1/188* (2013.01); *H01L 23/5389* (2013.01); *H01L 24/19* (2013.01); *H01L 24/20* (2013.01); *H01L 24/25* (2013.01); *H01L 24/96* (2013.01); *H05K 1/111* (2013.01); *H05K 1/185* (2013.01); *H05K 3/007* (2013.01); *H05K 3/3436* (2013.01); *H05K 3/4007* (2013.01); *H01L 2224/04105* (2013.01); *H01L 2224/2518* (2013.01); *H01L 2224/73267* (2013.01); *H01L 2224/92244* (2013.01); *H01L 2924/18162* (2013.01); *H05K 2201/10704* (2013.01); *H05K 2201/10977* (2013.01); *H05K 2201/10984* (2013.01); *H05K 2201/10992* (2013.01); *H05K 2203/0278* (2013.01); *H05K 2203/1189* (2013.01)

(58) Field of Classification Search
CPC ...................................... H05K 1/188
USPC ......................................... 174/261
See application file for complete search history.

(56) References Cited

U.S. PATENT DOCUMENTS

| | | | | |
|---|---|---|---|---|
| 6,010,769 A | * | 1/2000 | Sasaoka | H01L 21/4857 428/209 |
| 9,439,292 B1 | * | 9/2016 | Lin | H01L 23/5389 |

(Continued)

FOREIGN PATENT DOCUMENTS

| | | |
|---|---|---|
| EP | 0 411 985 A1 | 2/1991 |
| EP | 3 163 613 A1 | 5/2017 |

(Continued)

*Primary Examiner* — Stanley Tso
(74) *Attorney, Agent, or Firm* — Robert A. Blaha; Smith Tempel Blaha LLC

(57) ABSTRACT

A method of manufacturing a component carrier is disclosed. The method includes galvanically depositing at least part of at least one electrically conductive pillar on a component, and inserting the at least one electrically conductive pillar and an electrically insulating layer structure into one another.

11 Claims, 18 Drawing Sheets

(51) Int. Cl.
*H05K 3/00* (2006.01)
*H01L 23/538* (2006.01)

(56) References Cited

U.S. PATENT DOCUMENTS

| | | | |
|---|---|---|---|
| 2008/0171172 A1* | 7/2008 | Bae | B32B 3/06 |
| | | | 428/67 |
| 2011/0048783 A1* | 3/2011 | Yu | H05K 3/0035 |
| | | | 174/261 |
| 2011/0290540 A1* | 12/2011 | Jung | H01L 23/13 |
| | | | 174/255 |
| 2012/0056329 A1 | 3/2012 | Pagaila et al. | |
| 2013/0093100 A1 | 4/2013 | Shariff et al. | |
| 2014/0201992 A1 | 7/2014 | Lin et al. | |
| 2017/0025380 A1* | 1/2017 | Zhai | H01L 21/6835 |
| 2017/0256471 A1* | 9/2017 | Fang | H01L 21/56 |
| 2017/0358534 A1* | 12/2017 | Kim | H01L 23/3114 |
| 2019/0115362 A1* | 4/2019 | Choi | H01L 27/1157 |

FOREIGN PATENT DOCUMENTS

| | | |
|---|---|---|
| FR | 3 036 226 A1 | 11/2016 |
| TW | 200715930 A | 4/2007 |
| WO | WO 2009/048604 A2 | 4/2009 |

\* cited by examiner

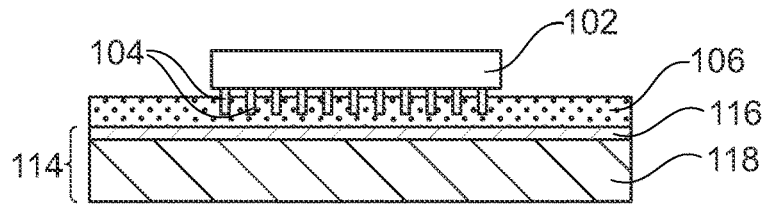
Fig. 4
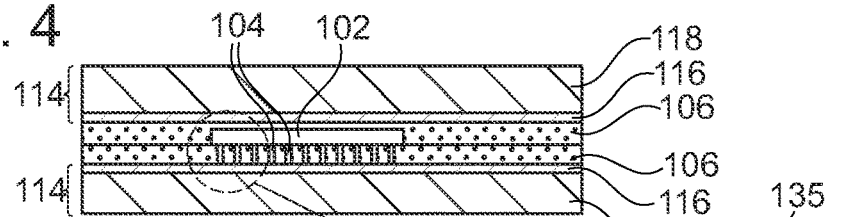
Fig. 5
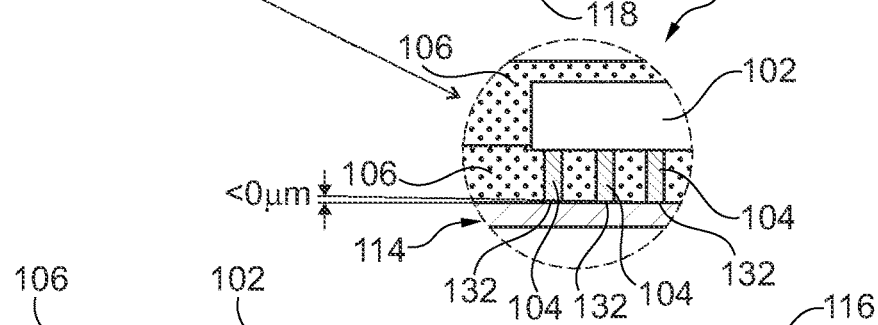
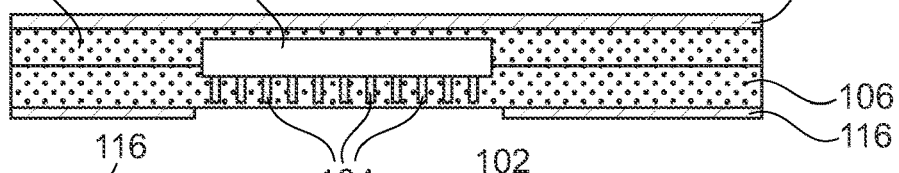
Fig. 6
Fig. 7
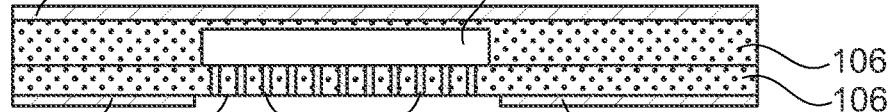
Fig. 8
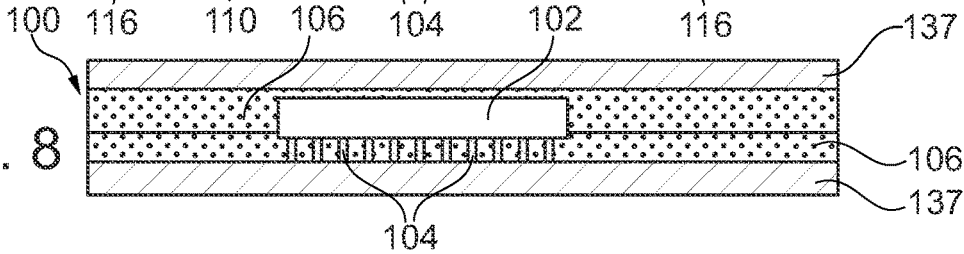
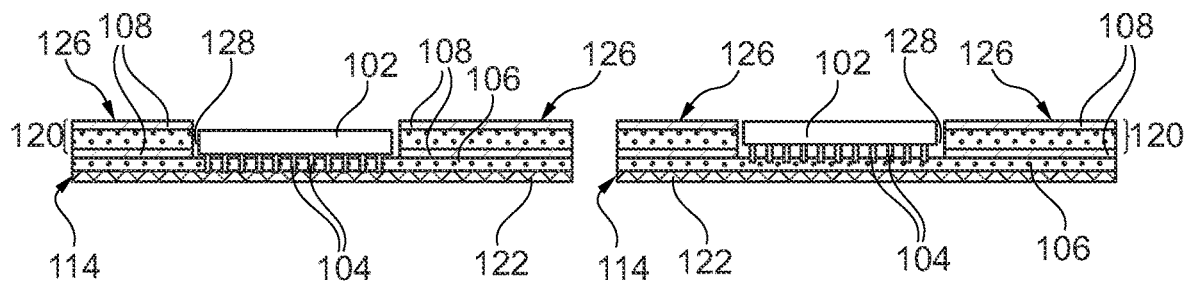
Fig. 9    Fig. 10

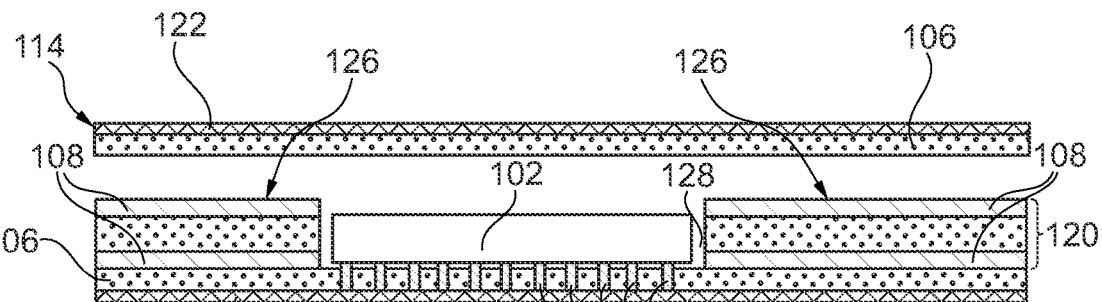
Fig. 11
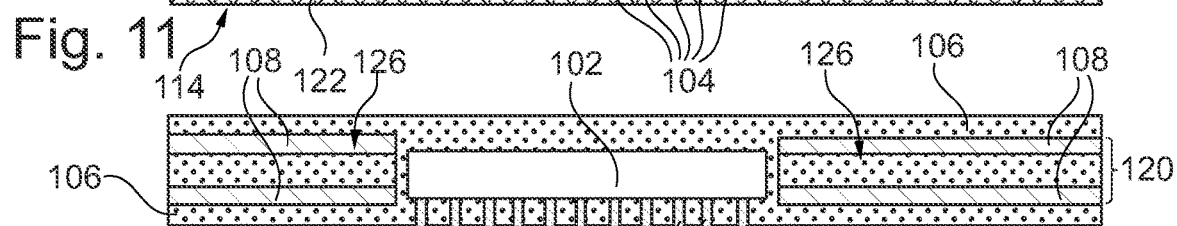
Fig. 12
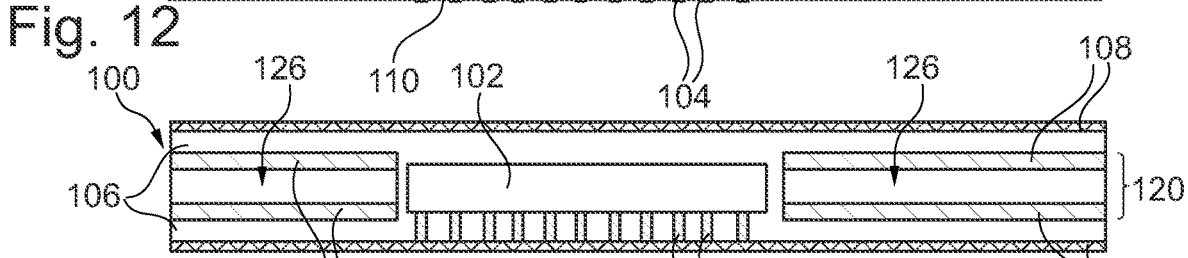
Fig. 13
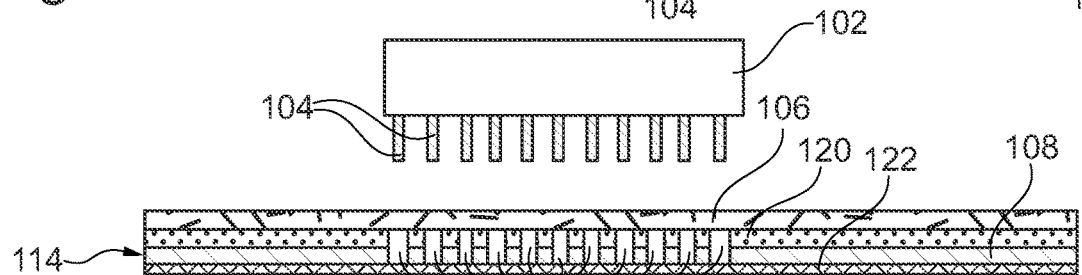
Fig. 14
Fig. 15
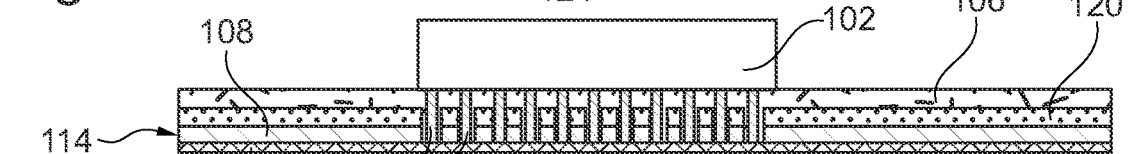
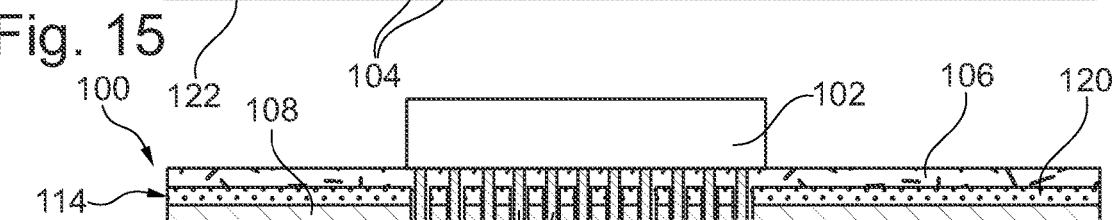
Fig. 16

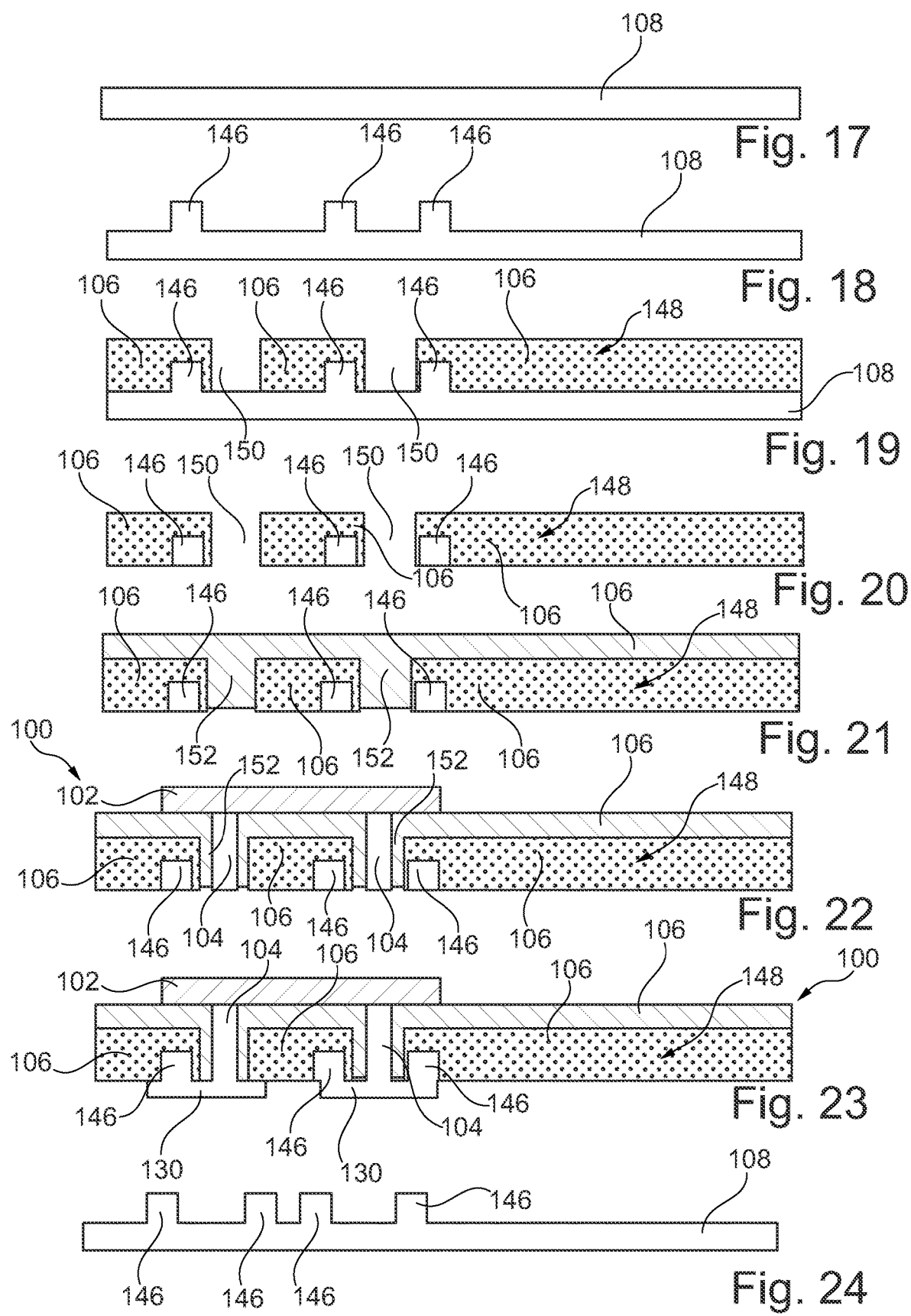

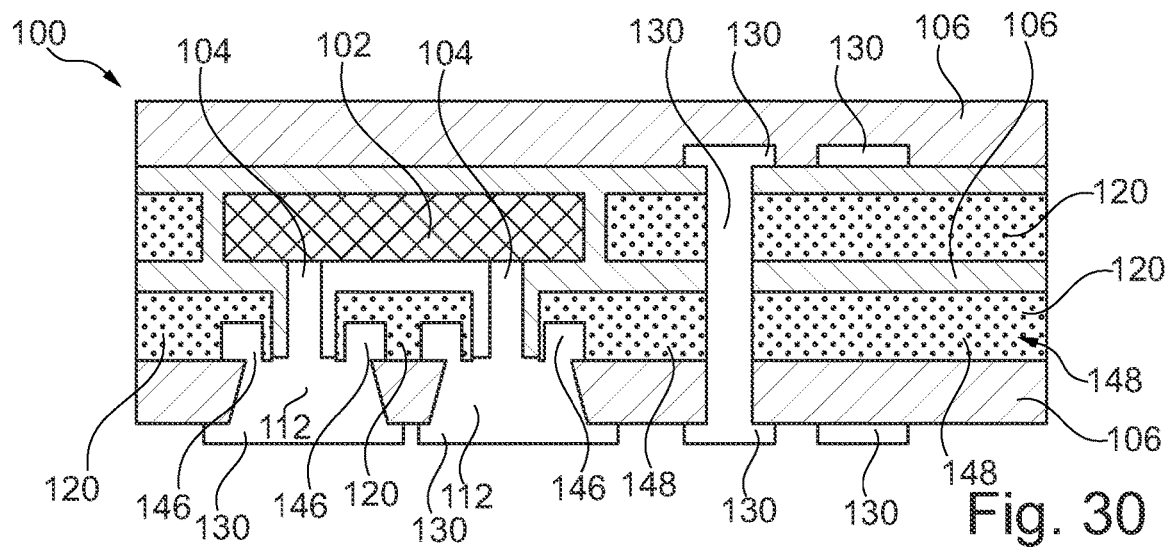
Fig. 30
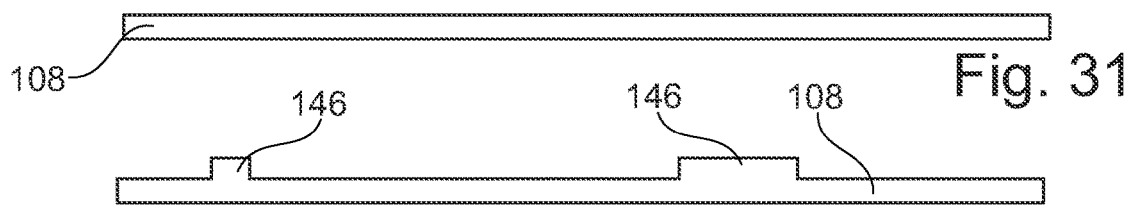
Fig. 31
Fig. 32
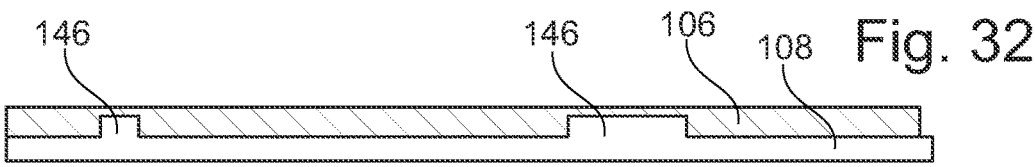
Fig. 33
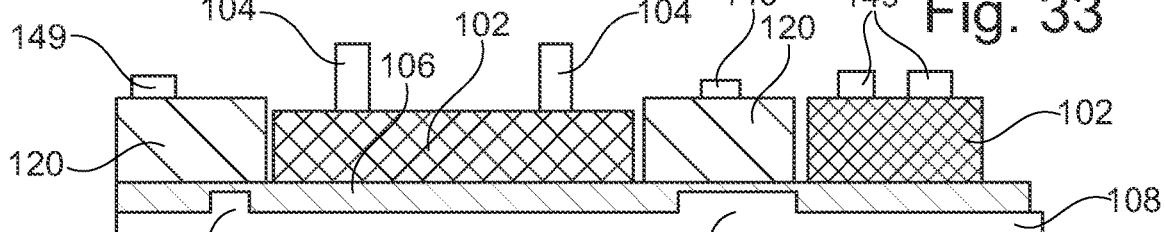
Fig. 34
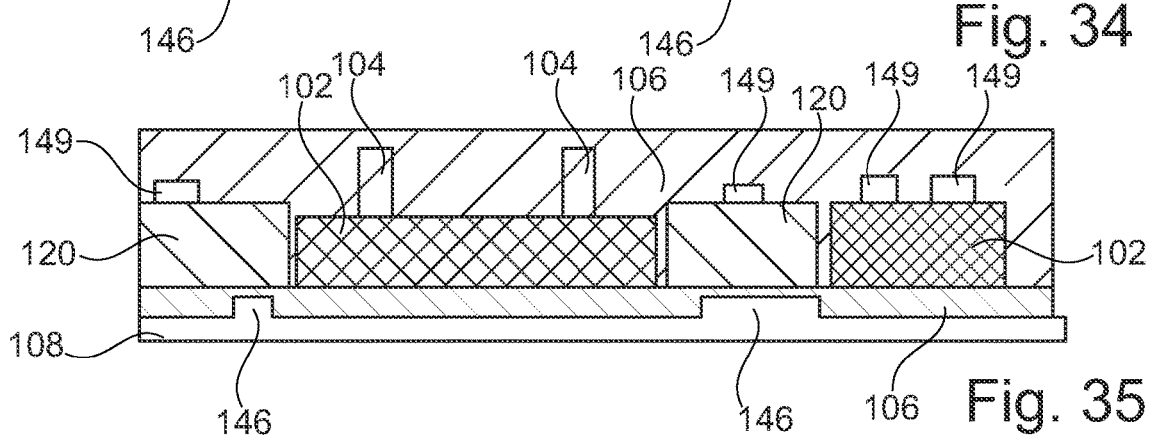
Fig. 35

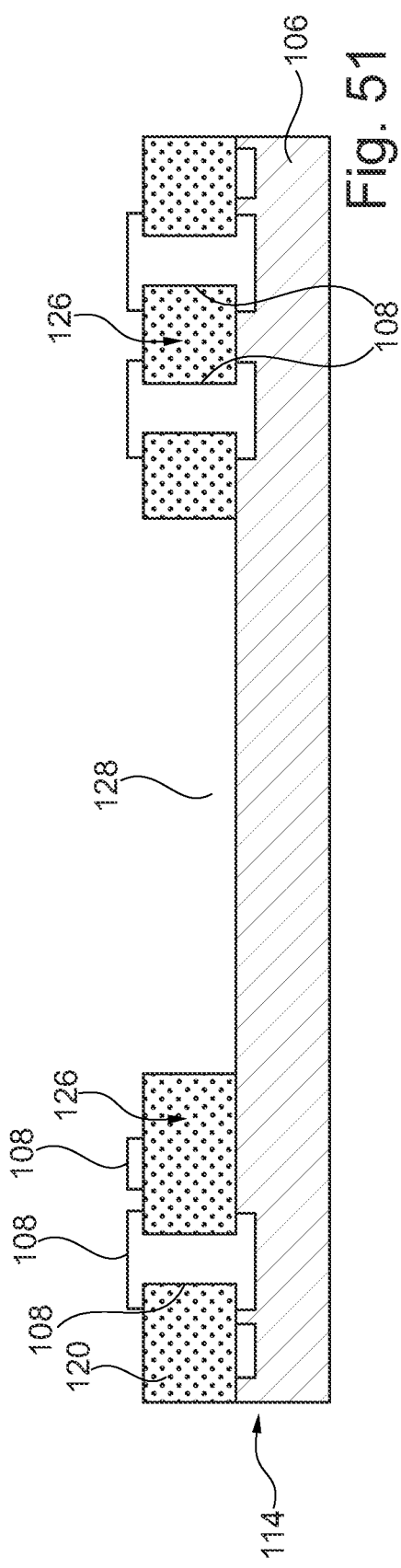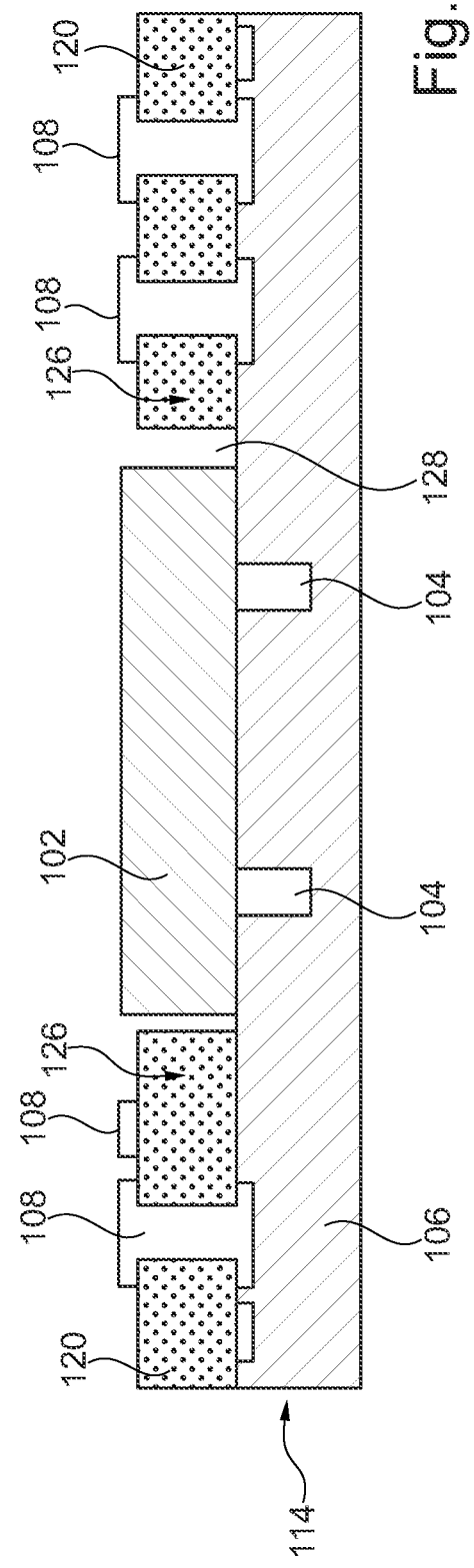

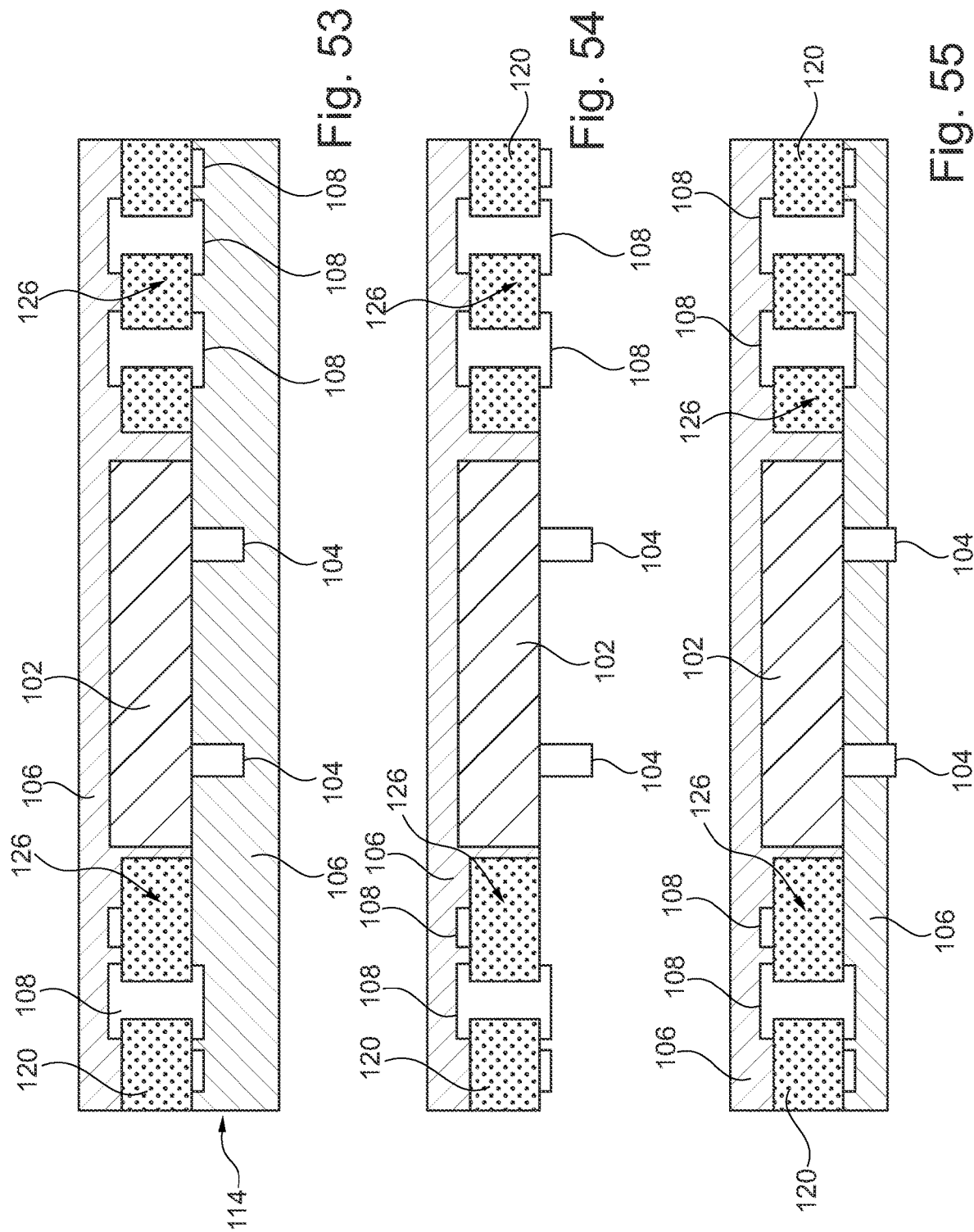

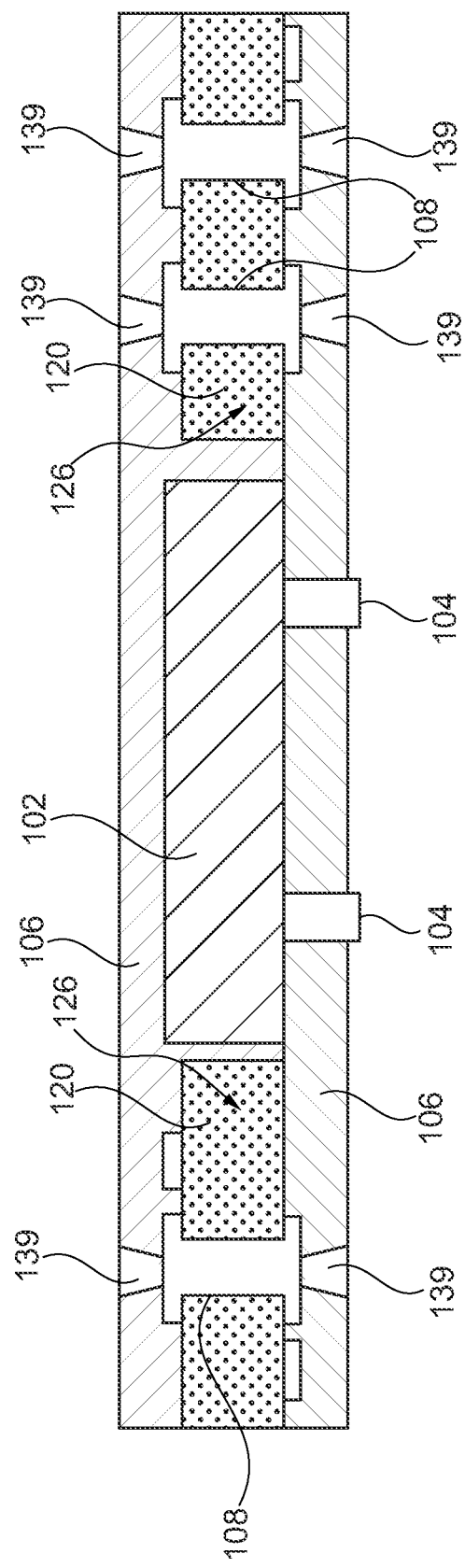
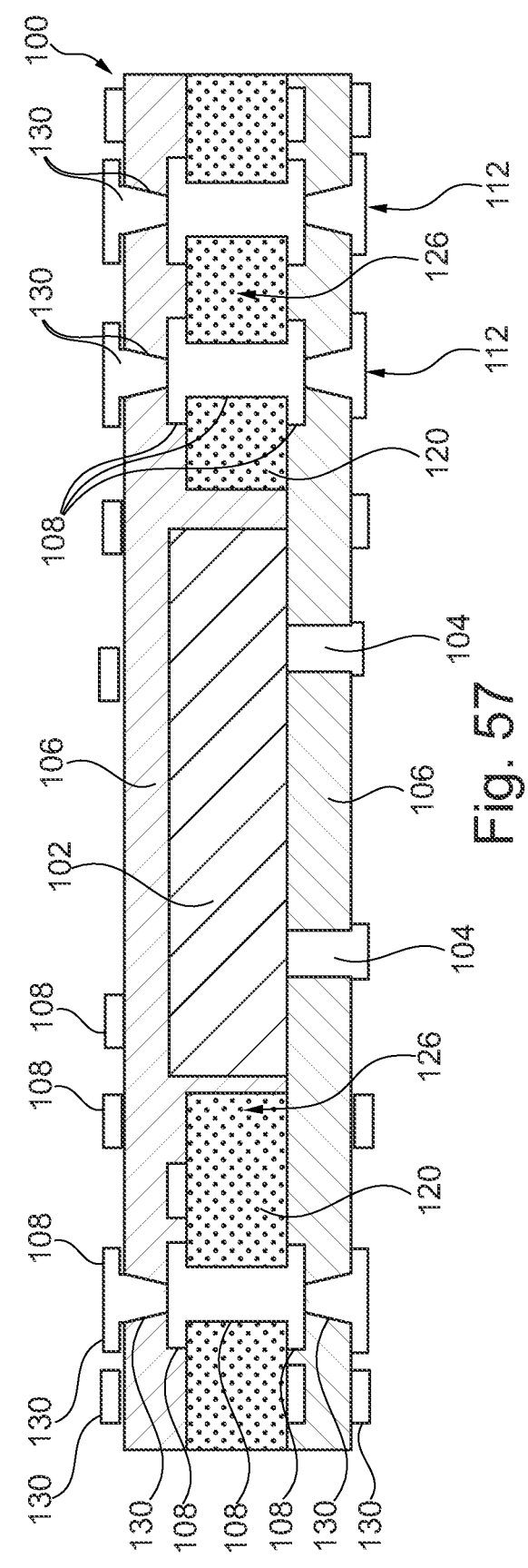

EMBEDDING COMPONENT WITH PRE-CONNECTED PILLAR IN COMPONENT CARRIER

TECHNICAL FIELD

The invention relates to a method of manufacturing a component carrier, and to component carriers.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation also becomes an increasing issue. At the same time, component carriers shall be mechanically robust and electrically reliable so as to be operable even under harsh conditions.

Moreover, efficiently embedding a component in a component carrier is an issue. This is in particular difficult when components are to be connected electrically with other constituents of a component carrier.

US 2014/201992 A1 discloses a method for fabricating a circuit board structure having at least an embedded electronic element, which includes the steps of providing a substrate and embedding at least an electronic element in the substrate with an active surface and a plurality of electrode pads of the electronic element exposed from a surface of the substrate, forming a plurality of conductive bumps on the electrode pads of the electronic element, and covering the surface of the substrate and the active surface of the electronic element with a dielectric layer and a metal layer stacked on the dielectric layer, wherein the conductive bumps penetrate the dielectric layer so as to be in contact with the metal layer.

TW 200715930 discloses a method for manufacturing a substrate embedded with an electronic device. An electronic component having a plurality of electrodes is disposed in a cavity of a core plate. By lamination, at least a metal foil is pressed on the core plate and the electronic component, such that the metal foil is electrically connected with the electrodes of the electronic component. Next, the metal foil is patterned to have a plurality of contacts.

SUMMARY

There may be a need to efficiently embed a component in a component carrier.

A method of manufacturing a component carrier and component carriers according to the independent claims are provided.

According to an exemplary embodiment of the invention, a method of manufacturing a component carrier is provided, wherein the method comprises galvanically depositing at least part of at least one electrically conductive pillar on a component, and inserting (and optionally fixing) the at least one electrically conductive pillar and an electrically insulating layer structure into one another. Thereby, at least part of an embedding procedure may be accomplished.

According to another exemplary embodiment of the invention, a component carrier is provided, wherein the component carrier comprises a carrier body having a cavity and comprising at least one electrically conductive layer structure at least partially forming a surface of the carrier body, a component with at least one connected electrically conductive pillar, wherein the component is arranged at least partially in the cavity, and an electrically insulating layer structure in which the at least one electrically conductive pillar is at least partially inserted so that the at least one electrically conductive pillar extends vertically beyond the at least one electrically conductive layer structure.

According to still another exemplary embodiment of the invention, a component carrier is provided, wherein the component carrier comprises a component with at least one connected cylindrical electrically conductive pillar, and an electrically insulating layer structure in which the at least one electrically conductive pillar is at least partially inserted and fixed.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above mentioned types of component carriers.

In the context of the present application, the term "pillar" may particularly denote a tiny post extending from the component and being oriented preferably substantially perpendicular to a main surface of the component. Such a pillar may be a lengthy structure extending in a pin-like or even spike-like way from the component. The aspect ratio can be defined as the ratio between a length and a diameter of the pillar.

In the context of the present application, the term "galvanically depositing" may particularly denote a manufacturing process of the pillar according to which the material of the pillar is at least partially deposited on or above a surface of the component or a pre-form thereof (in particular a wafer comprising multiple such components) by electroplating, in particular in an additive or semi-additive process. In such a process, the component or pre-form thereof may be immersed in a solution from which material solidifies on the component to thereby form the corresponding pillar or part of the pillar. Such a manufacturing process of forming at least part of the pillar may involve a lithographic procedure during which a surface of the component or pre-form thereof may be covered with a patterned photoresist or the like to thereby define one or more surface portions of the component where one or more pillars may be galvanically deposited. For galvanic deposition or electroplating of a metal such as copper, water based solutions (for instance electrolytes) may be used which contain the metal(s) to be deposited as ions (i.e. dissolved metal salts). An electric field between an anode and a work piece (such as the component with one or more pads or a pre-form thereof, for instance a wafer integrally connecting multiple such components with pads) as cathode may force positively charged metal ions to move to the cathode where they give up their charge and deposit themselves as metal on the surface of the work piece. Electroplating or galvanic deposition processes may encompass, besides the pure metal deposition, also preparative and/or post treatments of the component(s) to be coated.

In the context of the present application, the term "cylindrical" may particularly denote that the pillar(s) may have a cross-sectional shape and area which remains substantially constant along the entire extension of the pillar from a main surface of the component up to a free end of the pillar. In particular, this cross-sectional may be circular with a constant radius along the extension of the respective pillar.

In the context of the present application, the term "layer structure" may particularly denote one of a continuous layer, a patterned layer and an arrangement of multiple connected and/or non-connected islands within one plane. For instance, such a layer structure may be a continuous foil or sheet, whereas such a foil or sheet may also be patterned.

According to an exemplary embodiment of the invention, a component carrier manufacturing procedure is provided in which one or preferably multiple electrically conductive pillars are formed to extend from a main surface of a component, and extending substantially vertically thereto. Such pillars may be advantageously formed by a galvanic deposition process. Such a galvanic deposition process has the advantage that pillars may be formed simultaneously for multiple components even on a wafer level, i.e. in a configuration in which multiple pre-forms of components are still integrally connected in a wafer compound. This allows for a simple and an efficient production of the pillars with high robustness and small tolerance. Furthermore, by correspondingly selecting the duration of the galvanic deposition process, the length and therefore aspect ratio of the pillars may be precisely defined so that they can be properly configured to serve as post-like structures which may protrude into an electrically insulating layer structure by pressing. Moreover, the production of the pillars by galvanic deposition allows obtaining a significantly better spatial resolution and accurate definition of one pillar and of an arrangement of pillars, thereby increasing overall positional accuracy of the embedding procedure during the manufacturing of the component carrier. After having formed a component with pillar(s), the pillars may be mechanically pressed into the electrically insulating layer structure for insertion. An optional fixing between the component including the pillar(s) on the one hand and the electrically insulating layer structure on the other hand may then be accomplished for instance by the application of further pressure and/or heat to form an integral adhesion between pillar(s) and electrically insulating layer structure, for example by lamination. As a result, a component carrier with embedded component(s) and very high positional accuracy may be obtained with a simple manufacturing process which can be carried out efficiently in a batch procedure.

According to an exemplary embodiment of the invention, a manufacturing architecture for manufacturing component carriers such as printed circuit boards (PCBs) is provided which also allows embedding components with integrally formed (preferably copper) pillars. Embodiments may use the pillar(s) to penetrate an electrically insulating layer structure (such as a resin layer), for instance to contact an electrically conductive layer structure (such as a copper layer) below. Embodiments may also implement the application of a (for instance temporary) carrier for improving mechanical support during manufacturing (in particular during lamination). For instance, an electrically conductive layer structure such as a metal foil may serve as a carrier. In embodiments, laser drilling and plating processes may be dispensable for connecting the pillars, but may be added in other embodiments.

Highly advantageously, an electrically insulating layer structure may be provided so that one or more pillars extend vertically into the dielectric layer structure and beyond an electrically conductive layer structure of a carrier body (such as a core with electrically conductive traces) in which the component is located. By taking this measure, the pronounced extension of the protruding pillars simplifies an electric connection thereof (see for example FIG. 53 to FIG. 57).

In the following, further exemplary embodiments of the method and the component carriers will be explained.

In an embodiment, the method comprises providing the component with a plurality of electrically conductive pillars, in particular arranged in a regular pattern (for instance a matrix pattern), connected thereto. By providing multiple pillars arranged in accordance with a predefined pattern on one main surface of the component, even complex electrical connection architectures may be realized. The pillars may then serve for defining electrical paths within the component carrier, in particular for electrically connecting the component within the component carrier and/or with an electronic periphery. The pattern may be easily and precisely defined during the galvanic deposition procedure, by for example performance of a lithographic method.

In an embodiment, the at least one electrically conductive pillar has an aspect ratio of at least 0.2 (for instance diameter 50 µm, height 10 µm), in particular at least 1.5, preferably at least 2. As mentioned above, the aspect ratio may be defined as the ratio between a length of a pillar in a direction perpendicular to a main surface of the component on which the pillar is formed on the one hand and a diameter of the preferably cylindrical pillar on the other hand. With an aspect ratio of at least 1.5, preferably at least 2, it can be ensured that the pillar functions as a sort of pin or even spike which significantly simplifies and promotes the insertion of the one or more pillars into the electrically insulating layer structure during the described insertion procedure. By providing oblong pillars for connection, not only an electric connection task but simultaneously also a mechanical connection task may be fulfilled by the pillar(s).

In an embodiment, the at least one electrically conductive pillar comprises or consists of copper, in particular it may comprise a copper-titanium base portion and a copper top portion thereon. When the pillar comprises copper (in particular at a free end thereof), the component with pillar(s) is particularly appropriate for component carrier technology such as PCB (printed circuit board) technology which usually uses copper for electric connection purposes. Therefore, copper as top portion of the pillar is highly advantageous. In order to promote a reliable connection between a pad of the component (in particular when configured as a semiconductor chip), a base portion specifically adapted for such a connection is highly advantageous. For instance, a pad of a component may comprise or consist of aluminum which can be properly connected with a copper-titanium base portion of the pillar. Of course, other materials and material combinations are possible as well.

In an embodiment, the at least one electrically conductive pillar is formed by sputtering a base portion of a first material (in particular of copper-titanium) on the component, and by subsequently galvanically depositing a top portion of a second material (in particular copper) on the base portion. In particular, the majority of the pillar may be formed by galvanic deposition (i.e. the top portion), whereas a tiny flat base portion may be previously formed by sputtering for improving compatibility with a surface material of the component. Sputtering may be denoted as a process in which particles are ejected from a solid target material due to bombardment of the target by energetic particles. By this combination of sputtering and galvanic deposition, both a precise and robust manufacture of the pillar with sufficiently high aspect ratio and a proper adhesion between pillar and component may be obtained simultaneously.

In an embodiment, the component comprises at least one pad on which the at least one electrically conductive pillar is formed. In particular, the pad(s) may comprise or consist of aluminum, however pads made of another material such as copper are possible as well. Such a pad may for instance be manufactured as part of the back end of the line (BEOL) manufacturing process of a semiconductor chip as component.

In an embodiment, the method comprises galvanically depositing part of the at least one electrically conductive pillar for a plurality of integrally connected components (in particular embodied as semiconductor chips) on wafer level, and then singularizing the components each of which being provided with at least one respective electrically conductive pillar. According to such a highly preferred embodiment, multiple components (in particular multiple semiconductor chips) may be still integrally connected in a wafer compound at the time when the pillars of these components are simultaneously formed by applying a galvanic deposition procedure (preferably following an initial sputtering phase). This allows combining a high positional accuracy with an efficient manufacturing. After the formation of the pillars on wafer level, the wafer may be singularized, for example by mechanically sawing, laser cutting, chemical etching, etc.

In an embodiment, the method comprises providing the electrically insulating layer structure of an at least partially uncured material, and at least partially (preferably fulling) curing the at least partially uncured material of the electrically insulating layer structure during the inserting and fixing. In the context of the present application, the term "at least partially uncured material" particularly denotes material which has the property to at least partially melt or become flowable by the application of elevated pressure and/or elevated temperature, and become fully hardened or cured (and thereby becomes solid) when releasing the applied elevated pressure and/or elevated temperature. Consequently, applying elevated pressure and/or elevated temperature may cause melting of the curable or at least partially uncured material, followed by an irreversible hardening upon releasing the applied high pressure and/or high temperature. In particular, the "at least partially uncured material" may comprise or consist of B-stage material and/or A-stage material. By providing the layer structure from resin, prepreg or any other B-stage material, the layer structure may re-melt during lamination so that resin (or the like) may flow for interconnecting the various elements and for closing gaps or voids and may therefore contribute to a stable intrinsic interconnection within the component carrier under manufacture. Therefore, the fixing between pillars with components on the one hand and the electrically insulating layer structure on the other hand may be carried out by lamination, i.e. the application of pressure and/or heat, which results in a curing of previously at least partially uncured material of the electrically insulating layer structure for accomplishing the fixing and contributing to the embedding. Therefore, the formation of a provisional mechanical connection between pillars and layer structure by pressing the pillars into the layer structure may be followed by a fixing procedure establishing an integral connection between pillars and layer structure by curing at least partially uncured material of the layer structure. In another embodiment, inserting and fixing may be a common simultaneous procedure.

In an embodiment, the electrically insulating layer structure comprises or consists of a resin, prepreg, or a high-temperature stable photoresist (in particular being stable at least up to a temperature at which lamination of the electrically insulating layer structure occurs). For instance, the resin may be an epoxy resin which is capable of melting and cross-linking by the application of heat and/or mechanical pressure to thereby accomplish the fixation between pillars and layer structure. When a high temperature stable photoresist is used as layer structure, the photoresist may embed the pillars temporarily. After a further lamination process or the like (during which the high temperature stable photoresist remains intact), stripping the photoresist is then possible which again exposes the pillars for further processing of the pre-form of the component carrier. When using resin or prepreg (i.e. a resin matrix, in particular an epoxy resin matrix, with reinforcing particles, such as glass fibers, therein), the electrically insulating layer structure may form part of the readily manufactured component carrier.

In an embodiment, the method comprises connecting (in particular laminating) at least one electrically conductive layer structure and/or at least one further electrically insulating layer structure (in particular made of an at least partially uncured material) with the component. After having manufactured the structure composed of component with one or more pillars and electrically insulating layer structure, a further build-up of one or more electrically conductive layer structures and/or one or more further electrically insulating layer structures may be accomplished for refining the embedding. In particular, these further electrically insulating layer structures may comprise at least partially uncured material as described above, so that the build-up can be integrally connected to a common stack by applying heat and/or pressure, i.e. by lamination. By taking this measure, a component carrier with substantially any desired composition may be formed.

In an embodiment, the method comprises drilling (in particular by at least one of laser drilling and mechanically drilling) at least one hole through at least one of the electrically insulating layer structure and the at least one further electrically insulating layer structure. It is further possible to at least partially fill the at least one drilled hole with electrically conductive material (for instance by plating) to thereby contact the at least one electrically conductive pillar and/or directly the component. In particular, a connection between different pillars may be accomplished by drilling a hole and filling the latter with electrically conductive material (in particular copper), for instance by plating. Hence, a simple and efficient establishment of substantially any desired electric connection between the pillars may be obtained. In addition to or as an alternative to the formation of drilling holes and filling the latter with electrically conductive material for electric connection purposes, it is for instance also possible to attach an electrically conductive layer and pattern the latter for defining the desired electric connection traces.

In an embodiment, the method comprises attaching a carrier to the electrically insulating layer structure prior to the inserting. In order to provide sufficient mechanical support during the insertion (and optionally the fixing) procedure, it is possible to attach a carrier to the electrically insulating layer structure. Such a carrier may be a temporary carrier, i.e. may be later removed before completing manufacture of the component carrier. In other words, a temporary carrier does not form part of the readily manufactured component carrier. Alternatively, the carrier providing mechanical support during inserting and fixing may remain as part of the component carrier and may therefore form part thereof. It is also possible that only part of the carrier is later removed, and a remaining portion forms part of the final component carrier.

In an embodiment, the method comprises removing at least part of the attached carrier from the electrically insulating layer structure after to the inserting. When the carrier is a temporary carrier, it may be removed completely after inserting (and preferably fixing), when the presence of the temporary carrier for providing mechanical support is no longer needed. Such a need of a temporary carrier for providing mechanical support may exit no longer when the constituents of the component carrier itself have become mechanically sufficiently stable to provide support and avoid undesired effects such as warpage. For instance, curing an at least partially uncured material of the at least one electrically insulating layer structure may result in a hardening of the obtained structure and may render the presence of the temporary carrier for the further processing dispensable.

In an embodiment, the carrier comprises a core, or a core covered with at least one electrically conductive layer structure, or a thinner electrically conductive layer on a thicker electrically conductive layer, or a plastic layer (in particular a polyethylene terephthalate layer). Various forms of the carrier are possible, also combinations of the given examples. For example, the carrier may be flexible, for instance may comprise or consist of a sticky tape. It is however also possible that the carrier is mechanically stiff, for instance a fully cured core (for instance of FR4 material). Also the provision of the carrier as a stack of multiple electrically conductive layer structures (in particular of highly different thickness) which can be delaminated from one another selectively is an option. In the latter mentioned embodiment, a part of the carrier may remain part of the readily manufactured component carrier, whereas another part thereof may be removed after the temporary carrier has fulfilled its function of temporarily providing mechanical support. It has also turned out as possible to use a simple PET (polyethylene terephthalate) layer or polyester layer, or another plastic layer, as (in particular temporary) carrier.

In an embodiment, the carrier comprises at least one recess aligned with the at least one electrically conductive pillar so that during inserting, the at least one pillar is inserted into the at least one recess. According to such a preferred embodiment, the carrier, in addition to its mechanical support function, also serves simultaneously and synergistically as a mechanical guide structure for properly guiding the one or more pillars to a desired position during the connection procedure. In particular, a pattern of recesses may be formed in the carrier corresponding to a pattern of the pillars on the component. When the component with pillars is then pressed into the electrically insulating layer structure with the carrier with the recesses below, each of the pillars will enter into a corresponding one of the recesses where the respective pillar is safely prevented from mechanical damage. Thereby, a high degree of positional accuracy may be obtained while an erroneous insertion may be ruled out.

In an embodiment, the method comprises providing an accommodation structure with a cavity, and arranging the component with the at least one electrically conductive pillar in the cavity during the procedure of inserting. By providing an accommodation structure with a cavity having a dimension corresponding to a dimension of the component, the positional accuracy during the manufacturing process may be further improved. The component with pillars needs to be placed only in the cavity of a for instance pre-cut core and is then already properly aligned with regard to the electrically insulating layer structure to be connected with the component and its pillar(s).

In an embodiment, the at least one electrically conductive pillar has an extension in an inserting direction in a range between 5 μm and 50 μm. For instance, a length of the pillars may be 20 μm. A desired length may be properly defined by correspondingly adjusting the galvanic deposition procedure used for manufacturing the pillars. With the mentioned dimensions it has turned out possible to obtain pillars which can protrude into and even through the electrically insulating layer structure in the insertion procedure.

In an embodiment, the electrically insulating layer structure has a thickness in the range between 5 μm and 50 μm. For example, a proper thickness of the electrically insulating layer structure may be 20 μm. The thickness of the electrically insulating layer structure on the one hand and the pillars on the other hand may be adjusted to correspond to one another. For instance, the thickness of the electrically insulating layer structure may be selected to be substantially identical or completely identical to the extension of the pillars. It is however also possible that the extension of the pillars and the thickness of the layer structure differ by for instance not more than 10 μm, in particular not more than 5 μm. By taking this measure, it can be ensured that the free ends of the one or more pillars either protrude beyond the electrically insulating layer structure after the insertion process or are located close to a surface of the electrically insulating layer structure to be easily exposable by a subsequent treatment (for instance dielectric material removal procedure). It is also advantageous if the thicknesses of the various constituents (i.e. component with pillars, electrically insulating layer structure, but also an optional accommodation structure or the like) are selected correspondingly to each other so as to ensure a sort of stamping effect on the pillars during the insertion and/or fixing procedure. This ensures that the pillars properly protrude into the or even beyond the electrically insulating layer structure.

In an embodiment, the electrically insulating layer structure is a continuous electrically insulating layer structure penetrated by the at least one electrically conductive pillar. By providing the electrically insulating layer structure as a continuous layer such as a dielectric foil, a simple and reliable manufacturing process can be ensured. For instance, a pure resin foil of curable epoxy resin may be used, alternatively a prepreg layer (comprising curable resin and reinforcing particles such as glass fibres).

In an embodiment, the electrically insulating layer structure is a non-uniform electrically insulating layer structure having at least one protrusion for accommodating the at least one electrically conductive pillar. In particular, the method may comprise inserting the at least one electrically conductive pillar into the at least one protrusion. It is also possible to provide the electrically insulating layer structure as an already patterned layer or as a layer with a surface profile so as to provide sections accommodating pillars, with blind or through holes remaining between these sections. By taking this measure, any desired electric and mechanical connection architecture may be defined in a flexible way. In particular, the provision of an electrically conductive layer structure with a topology including one or more protrusions may allow defining a desired surface profile for accommodating the pillars in accordance with the requirements of a certain application.

In an embodiment, the method comprises forming at least one electrically conductive contact structure electrically contacting the at least one electrically conductive pillar with at least one further electrically conductive pillar and/or with any other electrically conductive trace within the component carrier. Such an electrically coupling between pillars and/or between pillar and trace may be established directly (i.e. by direct physical contact between pillar and further pillar or trace) or indirectly (with an electrically conductive interface in between the pillar and the further pillar or trace, for instance a solder structure, a pad, etc.). Such an electrically conductive contact structure may establish a mutual connection between different pillars from an electric point of view.

In an embodiment, the method comprises inserting the at least one electrically conductive pillar in the electrically insulating layer structure by applying pressure in the range between 2 bar and 15 bar, in particular in a range between 4 bar and 10 bar. Thus, the application of a moderate mechanical pressure may be sufficient for allowing the pillars penetrating into the electrically insulating layer structure.

In an embodiment, the method comprises inserting the at least one electrically conductive pillar in the electrically insulating layer structure at an elevated temperature in the range between 50° C. and 150° C., in particular in the range between 60° C. and 120° C. The heating of the component with pillar(s) during insertion and/or fixation simplifies the protrusion of the one or more pillars into the electrically insulating layer structure.

In one embodiment, it is possible that insertion and fixation are carried out by applying mechanical pressure and heat in a single procedure. In another embodiment, it has however turned out to be even more advantageous to firstly insert the one or more pillars into the electrically insulating layer structures by applying pressure on the component by a pick-and-place apparatus, followed by a separate lamination procedure during which the component with one or more pillars being already inserted into the electrically insulating layer structure is heated and made subject to mechanical pressure in a lamination press. The latter procedure provides particularly advantageous results in terms of mechanical integrity of the manufactured component carrier.

In an embodiment, the method comprises inserting the at least one electrically conductive pillar into the electrically insulating layer structure so that a free end of the at least one electrically conductive pillar remains within the electrically insulating layer structure, and subsequently removing part of the electrically insulating layer structure so that the free end is exposed. In such an embodiment, the free ends of the one or more pillars remain inside of the electrically insulating layer structure at the end of the fixation structure and are only later exposed by applying a material removal process. This protects the free ends of the tiny pillars from mechanical damage. For instance, the removing comprises a plasma treatment, a laser treatment, and/or a wet chemistry treatment. It is also possible to combine two or all three of the mentioned and/or other material removal procedures.

In another embodiment, the method comprises forwarding the at least one electrically conductive pillar into the electrically insulating layer structure during inserting so that a free end of the at least one electrically conductive pillar protrudes beyond the electrically insulating layer structure and is thereby exposed merely by the inserting. In such an alternative embodiment, the free ends of the one or more pillars are already exposed with regard to an environment for direct connection with another electrically conductive structure after the fixation procedure. This can for instance be ensured by selecting the extension of the pillars larger than the thickness of the electrically insulating layer structure. Such a procedure is very quick, because an individual material removal procedure for exposing free ends of the pillars may be dispensable.

In an embodiment, the component comprises a semiconductor chip being electrically contacted by a plurality of electrically conductive pillars. Each of the pillars may then correspond to a respective chip pad.

In an embodiment, the method comprises forming an electrically conductive trace structure, embedding the trace structure in a patterned electrically insulating matrix, attaching the electrically insulating layer structure to the matrix with embedded trace structure, and inserting (and optionally fixing) the at least one electrically conductive pillar of the component into the electrically insulating layer structure in a recess of the matrix. In such a highly preferred embodiment, embedded traces may be firstly formed in a dielectric matrix which may be later connected with the electrically insulating layer structure and the pillars. By taking this measure, even complex electric connection tasks may be carried out in a simple way.

In an embodiment, the inserting comprises moving the at least one electrically conductive pillar into the stationary electrically insulating layer structure. Thus, the insertion may be accomplished by keeping the electrically insulating layer structure in place and moving only the component with the pillars (for instance by a pick-and-place apparatus). In another embodiment, the inserting comprises moving the electrically insulating layer structure into the stationary at least one electrically conductive pillar. Thus, as an alternative to the previously described embodiment, it is also possible to keep the component with pillars spatially fixed and move the electrically insulating layer structure towards the pillars. In still another embodiment, both the at least one electrically conductive pillar and the electrically insulating layer structure are moved in opposite directions towards one another for insertion.

In an embodiment, the component comprises the at least one electrically conductive pillar only on one main surface thereof. Such an embodiment may for instance be advantageous when a component is used having electric contacts only on one main surface thereof. Even when the component has electrically conductive pads on both opposing main surfaces thereof, it is possible to provide pillars only on one main surface of the component carrier and accomplish the connection with the pads on the opposing other main surface of the component by forming (for instance laser) vias later.

In another embodiment, the component comprises one or more electrically conductive pillars on both opposing main surface thereof. In such an embodiment it is possible to provide both opposing main surfaces of the component with at least partially galvanically deposited pillars which can be connected with respective electrically insulating layer structures on both opposing main surfaces thereof. This allows obtaining a highly symmetric configuration with low tendency of undesired effects such as warpage or delamination.

In an embodiment, inserting and fixing comprises mechanically pressing the at least one electrically conductive pillar and the electrically insulating layer structure into one another for inserting, and subsequently laminating the at least one electrically conductive pillar and the electrically insulating layer structure, in particular by heating and/or applying mechanical pressure, for fixing. Therefore, the procedures of inserting and fixing may be two different processes. Alternatively, these two processes may however also be combined to one common process.

In an embodiment, the method further comprises, after the inserting (and optionally fixing), performance of at least one further processing step (i.e. one or more additional procedures of component carrier manufacture), and subsequently removing the electrically insulating layer structure from the component and the at least one electrically conductive pillar. Hence, the electrically insulating layer structure may be a temporary or permanent structure. When being a temporary structure, it may be removed from the component including pillars after a certain manufacturing procedure. Up to this point of the procedure, the electrically insulating layer structure may have served for mechanically protecting the sensitive pillars. In an alternative, the electrically insulating layer structure forms part of the readily manufactured component carrier.

In an embodiment, the method comprises forming, in particular at least partly by galvanically depositing, at least one further electrically conductive pillar (in particular directly or indirectly) on the at least one electrically conductive pillar. Such an electrically coupling between pillars may be established directly (i.e. by direct physical contact between pillar and further pillar) or indirectly (with an electrically conductive interface in between the pillar and the further pillar, for instance a solder structure, a pad, etc.). For instance, stacking multiple pillars on top of one another is then possible for a three-dimensional integration. Thus, different pillars may be stacked at different layers of the component carrier to extend the three-dimensional functionality of the component carrier. By stacking pillars, substantially any desired electric connection task may be carried out.

In an embodiment, the component is provided with at least one electrically conductive pillar (in particular with an array of electrically conductive pillars) on both opposing main surfaces of the component. Preferably but not necessarily, a part of the pillars on opposing main surfaces of the component are electrically connected with one another by electrically conductive connections extending through the component. This allows obtaining a double-sided interconnection architecture (see for instance FIG. 73).

The at least one component can be selected from a group consisting of an electrically non-conductive inlay, an electrically conductive inlay (such as a metal inlay, preferably comprising copper or aluminum), a heat transfer unit (for example a heat pipe), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, a light guiding element (for example an optical waveguide or a light conductor connection), and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite base structure) or may be a paramagnetic element. However, the component may also be a further component carrier, for example in a board-in-board configuration. The component may be surface mounted on the component carrier and/or may be embedded in an interior thereof. Moreover, also other components may be used as component.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier is a laminate-type body. In such an embodiment, the semifinished product or the component carrier is a compound of multiple layer structures which are stacked and connected together by applying a pressing force, if desired accompanied by heat.

BRIEF DESCRIPTION OF THE DRAWINGS

The invention will be described in more detail hereinafter with reference to examples of embodiment but to which the invention is not limited.

FIG. 4, FIG. 5, FIG. 6, FIG. 7 and FIG. 8 illustrate further cross-sectional views of structures obtained during performance of a method of manufacturing a component carrier according to the embodiment relating to FIG. 1 and FIG. 3.

FIG. 9 illustrates a cross-sectional view of a structure obtained during performance of a method of manufacturing a component carrier according to another exemplary embodiment of the invention.

FIG. 10 illustrates a cross-sectional view of a structure obtained during performance of a method of manufacturing a component carrier according to an exemplary embodiment of the invention.

FIG. 11, FIG. 12 and FIG. 13 illustrate cross-sectional views of structures obtained during performance of a method of manufacturing a component carrier, shown in FIG. 13, according to another exemplary embodiment of the invention.

FIG. 14, FIG. 15 and FIG. 16 illustrate cross-sectional views of structures obtained during performance of a method of manufacturing a component carrier, shown in FIG. 16, according to another exemplary embodiment of the invention.

FIG. 17, FIG. 18, FIG. 19, FIG. 20, FIG. 21, FIG. 22 and FIG. 23 illustrate cross-sectional views of structures obtained during performance of a method of manufacturing a component carrier, shown in FIG. 23, according to another exemplary embodiment of the invention.

FIG. 24, FIG. 25, FIG. 26, FIG. 27, FIG. 28, FIG. 29 and FIG. 30 illustrate cross-sectional views of structures obtained during performance of a method of manufacturing a component carrier, shown in FIG. 30, according to another exemplary embodiment of the invention.

FIG. 31, FIG. 32, FIG. 33, FIG. 34, FIG. 35, FIG. 36, FIG. 37, FIG. 38 and FIG. 39 illustrate cross-sectional views of structures obtained during performance of a method of manufacturing a component carrier, shown in FIG. 39, according to another exemplary embodiment of the invention.

FIG. 51, FIG. 52, FIG. 53, FIG. 54, FIG. 55, FIG. 56 and FIG. 57 illustrate cross-sectional views of structures obtained during performance of a method of manufacturing a component carrier, shown in FIG. 57, according to another exemplary embodiment of the invention.

DETAILED DESCRIPTION OF ILLUSTRATED EMBODIMENTS

Figure 1:
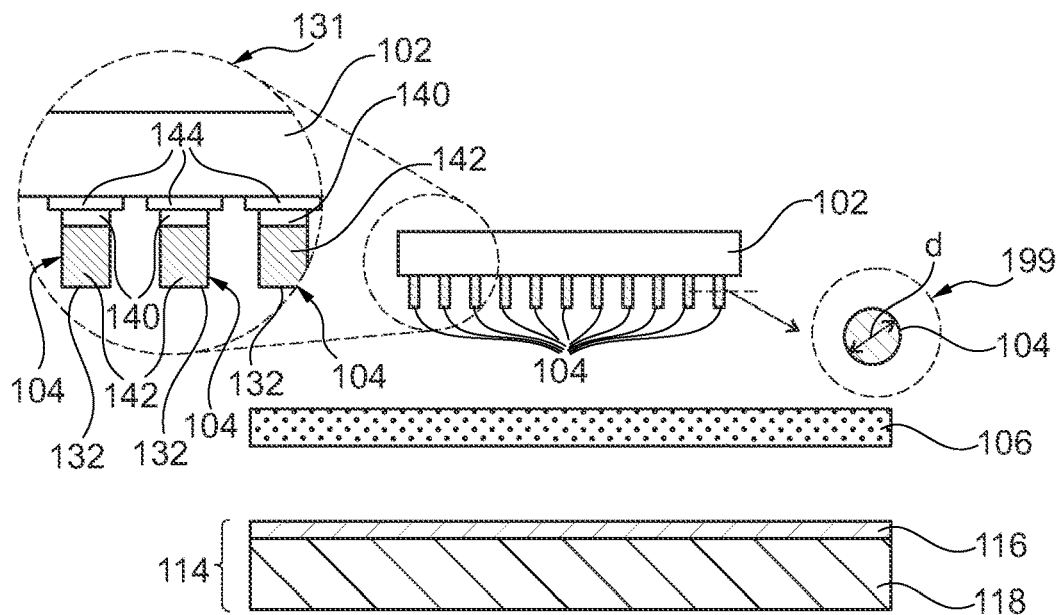
FIG. 1 illustrates a cross-sectional view of a structure obtained during performance of a method of manufacturing a component carrier according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a method of manufacturing a component carrier is provided which makes it possible to establish an ultra-high density interconnection with high number of input/output connections. More specifically, an architecture for embedding components with a high density pillar arrangement (in particular comprising copper) is provided. Correspondingly, a fan-out is made possible which enables ultra-high density interconnection with high numbers of input and output connections commonly referred to as I/Os. Such an embedding of components with high density copper pillars may be carried out by inserting them into and/or through an electrically insulating layer structure (such as a resin layer, or a photoresist such as a high-temperature stable photoresist). This allows obtaining an efficient fan-out enabling ultra-high-density interconnections. In particular, a resin sheet (as electrically insulating layer structure) may be laminated on a copper foil or a core (as temporary or permanent carrier). A component with one or more pillars (in particular made of copper) extending therefrom may be inserted into or even through the resin sheet. Examples for components which may be embedded according to such a method are semiconductor chips with high input/output (I/O) count, passive components, etc. Such chips or other components may be provided with one or more Cu-pillars by galvanic deposition (preferably on wafer level). Embedding does not necessarily require a sticky tape as temporary carrier.

Descriptively speaking, an exemplary embodiment provides a (in particular copper) pillar punching architecture in which one or more pillars galvanically formed on a component such as a semiconductor chip are punched into an electrically insulating layer structure for connection purposes. Such a manufacturing procedure for manufacturing a component carrier has the advantage of a high accuracy and the opportunity to manufacture slim packages. Such a pillar concept may allow at least partially substituting conventional laser vias to thereby simplify the manufacturing procedure and increase the positional accuracy. In addition the thermomechanical stress to the interfaces on the semiconductor induced by the laser drilling process can be eliminated by using copper pillars as interconnect elements. A corresponding manufacturing architecture is properly compatible with PCB (printed circuit board) technology, since it can be carried out solely using materials which are compatible with PCB manufacturing processes. For instance, copper pillars with a length in a range between 5 µm and 100 µm may be used. The mentioned electrically insulating layer structure may be a resin sheet having a thickness in a range between 5 µm and 100 µm. Additionally, one or more copper foils or cores (in particular made of fully cured material such as FR4) may be implemented for continuing a build-up of the component carrier under manufacture, or as a (in particular temporary) carrier. A temporary carrier may hence also be made of PCB compatible materials such as copper foils, PET foils, etc.

The aspects defined above and further aspects of the invention are apparent from the examples of embodiment to be described hereinafter and are explained with reference to these examples of embodiment.

FIG. 1 illustrates a cross-sectional view of a structure obtained during performance of a method of manufacturing a component carrier 100 according to an exemplary embodiment of the invention.

More specifically, FIG. 1 shows a component 102 (such as a semiconductor chip) which has been treated by a galvanic depositing procedure for integrally forming an array of electrically conductive pillars 104 arranged in a regular pattern on one main surface of the component 102. The component 102 may be electrically contacted within the component carrier 100 to be formed by the electrically conductive pillars 104. In particular, the pillars 104 may all have the same shape, dimension, material composition and mutual distance from one another. Alternatively, different pillars 104 may also have different properties.

FIG. 1 shows the component 102 with the downwardly protruding pillars 104 prior to being inserted and fixed in an electrically insulating layer structure 106 which is here embodied as an uncured epoxy resin sheet. For example, the electrically insulating layer structure 106 may be a continuous layer and may have a thickness of 20 µm. By providing the electrically insulating layer structure 106 of an uncured material, curing of the uncured material of the electrically insulating layer structure 106 during and/or after the inserting by heat and pressure may efficiently promote fixing the component 102 with its pillars 104 at material of the layer structure 106 to thereby accomplish an integral connection. In the shown configuration, the electrically insulating layer structure 106 is embodied as a continuous resin foil of uncured material which is capable of being cured during lamination to thereby establish an integral connection between the pillars 104 and the material of the electrically insulating layer structure 106.

As can be taken from FIG. 1, the electrically conductive pillars 104 may have a relatively large aspect ratio of more than 2. In other words, the ratio between the length of the pillars 104 in a vertical direction and a diameter of the pillars 104 in a horizontal direction is larger than 2 in the shown embodiment. For instance, the length of a respective electrically conductive pillar 104 may be 20 µm. Thus, an array of parallel pillars 104 extending all from a lower main surface of component 102 is shown.

A detail 131 of FIG. 1 illustrates a composition of the pillars 104. Each of the pillars 104 comprises a flat copper-titanium base portion 140 and an oblong copper top portion 142 thereon. The pillars 104 are manufactured by sputtering the base portion 140 for instance of copper-titanium on (for example aluminum) pads 144 of the component 102. The manufacture of the pillars 104 is completed by subsequently galvanically depositing the top portion 142 of for example pure copper, on the base portion 140. This manufacture can be advantageously performed efficiently and accurately on wafer level, i.e. for multiple still integrally connected chip-type components 102 simultaneously, see FIG. 48 to FIG. 50. The copper-titanium alloy (can be also a modification of barrier layer metals like titanium/tungsten and nickel as an additional barrier layer followed by the copper layer) of the base portion 140 ensures a reliable mechanical and electrical connection with the pads 144. The top portion 142 of the pillars 104 formed by galvanic deposition procedure on wafer level (compare FIG. 48 to FIG. 50) enables a proper connection to other copper structures of the component carrier 100 being manufactured. A further detail 199 in FIG. 1 shows that the pillars 104 may have a circular cross-sectional shape, i.e. may be circular cylindrical. In the shown embodiment, the diameter or twice of the radius of the cylindrical pillars 104 is denoted with reference numeral "d" which may for instance be 30 µm.

For the purpose of providing proper mechanical support and for increasing accuracy during the procedures of inserting and fixing, it is advantageously possible to temporarily attach a carrier 114 to the electrically insulating layer structure 106 prior to the inserting. As will be described below, part of the carrier 114 will be removed before completing manufacture of the component carrier 100, whereas another part of the carrier 114 remains part of the readily manufactured component carrier 100. In the shown embodiment, the temporary carrier 114 comprises a double layer stack composed of a thinner electrically conductive layer 116 (for instance made of copper and having a thickness of typical 2 µm) on a thicker electrically conductive layer 118 (for instance made of copper and having a thickness of 70 µm). In the shown embodiment, the carrier 114 is hence composed of two copper foils with significantly different thicknesses. As described below, the electrically conductive layer structure 118 embodied as copper foil having a thickness of 70 µm is later removed from the layer stack and does not form part of the final component carrier 100, whereas electrically conductive layer structure 116 embodied as copper foil having a thickness of 2 µm forms part of the manufactured component carrier 100. For the purpose of a corresponding later separation, delamination between the electrically conductive layer structures 116, 118 is rendered possible at an interface between these copper foils, for instance by a release layer (not shown) in between.

Inserting the pillars 104 into the layer structure 106 may be carried out by approaching component 102 towards layer structure 106 and applying a pressure of for example 8 bar which may be accompanied by an elevated temperature of the component 102 of for instance 90° C. Another method to place the copper pillars 104 of the component 102 in the dielectric (i.e. into layer structure 106) is to apply assembly force and temperature to the component 102 by the assembly head of an assembly equipment. The temperature can be, for example, in a range of 80° to 120° C. depending on the type of dielectric, and the force needs to be adjusted to the size of the component 102 and the number of pillars 104 to penetrate them in the dielectric, i.e. in the layer structure 106. For the inserting procedure, the component 102 with its pillars 104 may thus be moved downwardly according to FIG. 1 into the here stationary electrically insulating layer structure 106 on the temporary carrier 114. Mechanically pressing the heated component 102 with electrically conductive pillars 104 into the electrically insulating layer structure 106 may establish the insertion. Subsequently, the electrically conductive pillars 104 protruding beyond the main surface of the component 102 and into the electrically insulating layer structure 106 may be laminated by heating and applying mechanical pressure for integrally fixing the different materials to one another.

Figure 2:
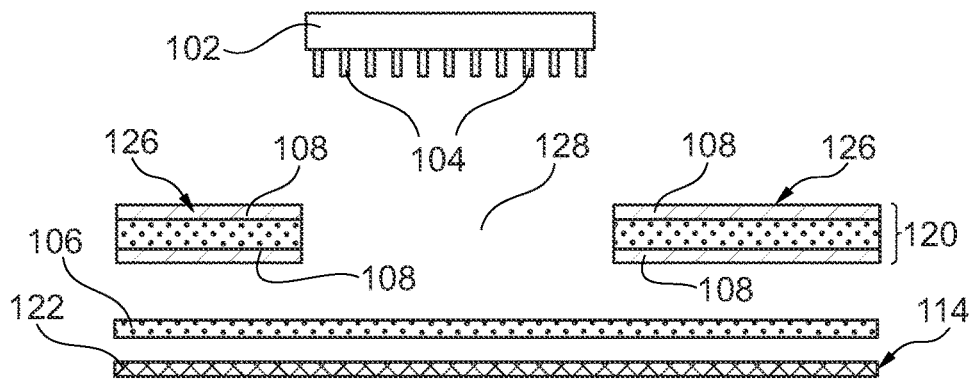
FIG. 2 illustrates a cross-sectional view of a structure obtained during performance of a method of manufacturing a component carrier according to another exemplary embodiment of the invention.

FIG. 2 illustrates a cross-sectional view of a structure obtained during performance of a method of manufacturing a component carrier 100 according to another exemplary embodiment of the invention.

According to FIG. 2, an accommodation structure 126 with a cavity 128 is additionally provided, wherein the component 102 with the pillars 104 is arranged in the cavity 128 during the procedure of inserting. The cavity 128 is hence dimensioned so that the component 102 can be inserted into the cavity 128 by a simple pick-and-place procedure. The accommodation structure 126 is embodied as a fully cured core 120 (for instance of FR4 material) covered on both opposing main surfaces thereof with a respective copper foil as electrically conductive layer structures 108.

In the embodiment of FIG. 2, the carrier 114 is a temporary carrier (i.e. being completely removed from the stack before completion of the manufacture of the component carrier 100) and is here embodied as a PET foil or other plastic layer 122.

Figure 3:
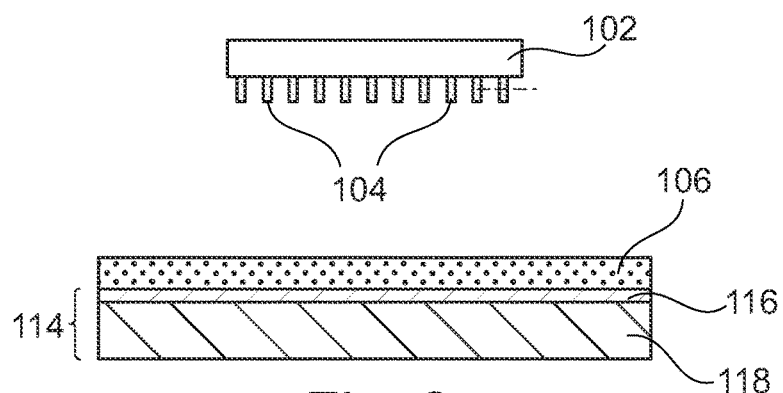
FIG. 3 illustrates a cross-sectional view of a structure obtained during performance of a method of manufacturing a component carrier according to the embodiment of FIG. 1.

FIG. 3 illustrates a cross-sectional view of a structure obtained during performance of a method of manufacturing a component carrier 100 according to the embodiment of FIG. 1. FIG. 3 thus shows an arrangement according to FIG. 1, wherein meanwhile the electrically insulating layer structure 106 has been attached to the carrier 114. A corresponding pre-lamination can be carried out at a temperature between 60° C. and 130° C. and at a pressure between 4 bar and 10 bar with vacuum depending on the type of material.

FIG. 4 to FIG. 8 illustrate further cross-sectional views of structures obtained during performance of a method of manufacturing a component carrier 100, shown in FIG. 8, according to the embodiment relating to FIG. 1 and FIG. 3.

In order to obtain the structure shown in FIG. 4, the component 102 with the pillars 104 is pressed, for instance by a pick-and-place apparatus (not shown) into the electrically insulating layer structure 106. During this insertion procedure or alternatively later in a separate procedure, fixation between the component 102 with its pillars 104 on the one hand and the electrically insulating layer structure 106 on the other hand may be accomplished by the application of pressure and heat, i.e. by lamination. During the process according to FIG. 4, the temperature of a bond stage may be 25° C. Touchdown may occur at a force of 3 N, and the force may be ramped to 100 N within 30 seconds. The pick and place tool may be at a temperature of 25° C., wherein the temperature may be ramped up to 120° C. A result is a complete underfilling with a resin flow on the edge of the die-type component 102. Later, post-curing may be carried out for 30 minutes at a temperature of 100° C. and a pressure of 8 bar.

In order to obtain the structure shown in FIG. 5, a further carrier 114, which may have an identical composition as the temporary carrier 114 shown in FIG. 1, can be connected to an upper main surface of the component 102 and the electrically insulating layer structure 106. A further uncured electrically insulating layer structure 106 (for instance a prepreg sheet or a resin sheet) may be sandwiched between the above mentioned electrically insulating layer structure 106 and the component 102 on the one hand and the further temporary carrier 114 on the other hand.

The mentioned constituents can be connected to one another by lamination, for instance by a treatment at a temperature of 180° and a pressure of 8 bar applied for 30 minutes. During this procedure, the previously at least partially uncured material of the electrically insulating layer structures 106 will soften but not melt, cross-linking will occur, and after re-solidification of the material of the electrically insulating layer structures 106, an integral connection between the component 102 with pillars 104 and the now cured material of the electrically insulating layer structures 106 as well as the carriers 114 can be accomplished. Thereby, a very symmetric configuration is obtained, as shown in FIG. 5.

A detail 135 in FIG. 5 illustrates that, as a result of the described lamination procedure in combination with the selected thicknesses of the various constituents, free ends 132 of the pillars 104 may already contact the electrically conductive layer structure 116 of the carrier 114. In other words, by the described punching technique, the formation of this electric contact may already be established. In other words, the described final lamination procedure may already establish full contact between the free ends 132 and the electrically conductive layer structure 116. The free ends 132 may even slightly protrude into the electrically conductive layer structure 116. This is illustrated in FIG. 5 with the denotation "<0 µm".

Alternatively, it is possible that the dimensions of the constituents are adjusted so that a dielectric gap (of for instance 1 µm to 5 µm) remains between the free ends 132 and the electrically conductive layer structure 116. In such an alternative embodiment, the free ends 132 are therefore still embedded in dielectric material of the electrically insulating layer structure 106.

Now referring to FIG. 6, the respective electrically conductive layer structure 118 of the respective carrier 114 may be removed, for instance may be peeled off. More precisely, the respective thicker electrically conductive layer structure 118 may be removed from the respective thinner electrically conductive layer structure 116 by delamination. In view of the completion of the lamination procedure, the mechanical supporting function of the thicker electrically conductive layer structures 118 is no longer needed. The thinner electrically conductive layer structures 116 may however remain attached to the rest of the structure shown in FIG. 6 and may be used for forming electrically conductive traces of the component carrier 100 to be produced.

As can be taken from FIG. 6 as well, the lower electrically insulating layer structure 116 may be patterned so as to expose a surface portion of the electrically insulating layer structure 106. A further option is to remove the thin electrically conductive layer completely and to deposit copper on the bare laminate of the full panel for a following semi-additive process. However, as illustrated in FIG. 6 and described above, it may happen that the free ends 132 of the pillars 104 do not extend beyond the lower main surface of the electrically insulating layer structure 106 after lamination. FIG. 6 hence shows that the electrically conductive pillars 104 are inserted into the electrically insulating layer structure 106 so that their free ends 132 still remain within the electrically insulating layer structure 106.

Referring to FIG. 7, surface material of the electrically insulating layer structure 104 is removed so that the free ends 132 of the electrically conductive pillars 104 are exposed to render them accessible for a subsequent electric contacting procedure. This material removing procedure may be accomplished by a plasma treatment, a laser treatment and/or a wet chemistry treatment. In order to expose the free ends 132 of the pillars 104 in preparation of a subsequent electric connection procedure of connecting the pillars 104 to an electronic environment, it is possible to carry out one or more of the described material removal procedures removing a surface portion of the exposed section of the electrically insulating layer structure 106.

In the scenario of detail 135 of FIG. 5, removing material of the electrically insulating layer structure 106 may be dispensable. It may alternatively however be performed also in this embodiment to ensure that the free ends 132 of the pillars 104 are in fact completely free of dielectric material.

FIG. 8 shows that, after having obtained the structure shown in FIG. 7, a copper plating procedure may be performed to thicken the electrically conductive material on both opposing main surfaces of the structure shown in FIG. 7. As a result, thick electrically conductive layer structures 137 are obtained. The latter may be subsequently patterned for the formation of a corresponding electrically conductive contact structure for contacting the now exposed free ends 132 of the pillars 104 in accordance with a certain electronic application.

FIG. 9 illustrates a cross-sectional view of a structure obtained during performance of a method of manufacturing a component carrier 100 according to another exemplary embodiment of the invention. More specifically, FIG. 9 shows an embodiment obtained based on the manufacturing architecture according to FIG. 2. Here, the pillars 104 extend up to the temporary carrier 114 which is here embodied as a plastic layer 122 such as a PET foil.

FIG. 10 illustrates a cross-sectional view of a structure obtained during performance of a method of manufacturing a component carrier 100 according to another exemplary embodiment of the invention. The embodiment of FIG. 10 corresponds to the embodiment of FIG. 9 with the exception that the free ends 132 of the pillars 104 are still spaced with regard to the temporary carrier 114, i.e. are still located in an interior of the electrically insulating layer structure 106.

FIG. 11 to FIG. 13 illustrate cross-sectional views of structures obtained during performance of a method of manufacturing a component carrier 100, shown in FIG. 13, according to another exemplary embodiment of the invention.

FIG. 11 shows that a further electrically insulating layer structure 106 (for instance a prepreg foil or a resin foil, being at least partially uncured), as well as a further temporary carrier 114 embodied as plastic foil 122 are arranged on top of the structure shown in FIG. 9. The plastic foil 122 may be connected to the further electrically insulating layer structure 106.

Referring to FIG. 12, the constituents according to FIG. 11 are connected to one another by lamination, i.e. heating and applying pressure. During this procedure, the various constituents are connected to one or other and gaps of cavity 128 are also filled with material of the previously uncured electrically insulating layer structures 106. Thereafter, the temporary carriers 114 are removed from both opposing main surfaces of the obtained structure. As shown in FIG. 12, the electrically conductive pillars 104 are inserted into and protruding through the electrically insulating layer structure 106 so that a respective free end 132 of each of the pillars 104 extends beyond the electrically insulating layer structure 106 and is thereby exposed and accessible for establishing an electric connection with traces of the component carrier 100 being presently manufactured.

The component carrier 100 (or pre-form thereof) shown in FIG. 13 can then be obtained by plating the two opposing main surfaces of the structure shown in FIG. 11, to thereby form electrically conductive layer structures 108 with electrically conductive material, in particular copper. Although not shown in the figures, these electrically conductive layer structures 108 may be patterned in order to form a desired electrical connection trace.

FIG. 14 to FIG. 16 illustrate cross-sectional views of structures obtained during performance of a method of manufacturing a component carrier 100, shown in FIG. 16, according to another exemplary embodiment of the invention.

Referring to FIG. 14, the carrier 114 is provided as a plastic foil 122 covered with a core 120 with an electrically conductive layer structure 108 (in particular a copper foil) in between. Core 120 and electrically conductive layer structure 108 of the carrier 114 are provided with a regular pattern of recesses 124 aligned with the regular pattern of electrically conductive pillars 104 extending downwardly from the component 102 so that during inserting, each of the pillars 104 is inserted into a respective one of the aligned recesses 124. FIG. 14 illustrates that the parallel array of pillars 104 and the parallel array of recesses 124 of carrier 114 are aligned or are in flush with one another so that lowering the component 102 with the pillars 104 towards the carrier 114 will result in a guided insertion of each of the pillars 104 in a respective one of the recesses 124. During this procedure, the array of recesses 124 in the carrier 114 serves as a guiding structure for guiding the pillars 104 to a desired position. After this guided insertion, there are still tiny gaps in the recesses 124 between the pillars 104 and the vertical and/or horizontal walls of the carrier 114.

The structure shown in FIG. 15 can be obtained by laminating the structure shown in FIG. 14 after the described inserting procedure, i.e. by the application of pressure and/or heat. As a result, the previously at least partially uncured material of the electrically insulating layer structure 106 will melt, become flowable, will fill the above-mentioned gaps and will then be re-solidified. As a result, the gaps will be at least partially, preferably completely, filled with material of the electrically insulating layer structure 106, and the pillars 104 are fixed in now cured material of the electrically insulating layer structure 106.

The structure shown in FIG. 16 can be obtained by removing the plastic foil 122 from a bottom of the structure shown in FIG. 15. If desired, further lamination and/or contact formation procedures may be carried out (not shown) for completing manufacture of component carrier 100.

FIG. 17 to FIG. 23 illustrate cross-sectional views of structures obtained during performance of a method of manufacturing a component carrier 100, shown in FIG. 23, according to another exemplary embodiment of the invention.

The starting point of the procedure according to the embodiment of FIG. 17 to FIG. 23 is a copper foil as electrically conductive layer structure 108, see FIG. 17. In the shown embodiment, the electrically conductive layer structure 108 is a continuous metallic layer.

Referring to FIG. 18, an electrically conductive trace structure 146 (preferably made of copper) is formed on the electrically conductive layer structure 108. The traces of the trace structure 146 are formed on the electrically conductive layer structure 108, for instance by a corresponding lithography and deposition procedure.

Referring to FIG. 19, the trace structure 146 is embedded in a patterned electrically insulating matrix 148, which may be made of an at least partially uncured electrically insulating material such as prepreg or resin. The insulating matrix 148 can however also be a cured material. As can be taken from FIG. 19, the patterned dielectric matrix 148 embeds the traces 146.

The structure shown in FIG. 20 may be obtained by removing the copper foil constituting the electrically conductive layer structure 108, from the structure shown in FIG. 19. The result is a patterned structure having recesses 150.

Referring to FIG. 21, an electrically insulating layer structure 106 made of an at least partially uncured material such as resin is attached to the dielectric matrix 148 with the embedded trace structures 146. In the illustrated embodiment, the electrically insulating layer structure 106 is a continuous, but non-uniform electrically insulating layer structure 106 having multiple protrusions 152 for later accommodating respective electrically conductive pillars 104. The protrusions 152 fill the recesses 150 of the matrix 148. The structure shown in FIG. 21 is obtained by attaching electrically insulating layer structure 106 to the structure of FIG. 20. The protrusions 152 extend into the recesses 150 of the dielectric layer denoted with reference numeral 148. Furthermore, the electrically insulating layer structure 106 covers the entire upper main surface of the structure shown in FIG. 20 in such a way that the structure shown in FIG. 21 has no surface profile.

Referring to FIG. 22, the electrically conductive pillars 104 of the component 102 are inserted into the protrusions 152. The pillars 104 may also be fixed within material of the protrusions 152 of the electrically insulating layer structure 106 in the respective recesses 150 of the matrix 148. FIG. 22 shows what happens when the component 102 with the protrusions 104 are inserted under pressure and at elevated temperature into the structure shown in FIG. 21. The pillars 104 will enter into the protrusions 152 of the electrically insulating layer structure 106.

Referring to FIG. 23, an electrically conductive contact structure 130 (preferably made of copper) is formed for electrically contacting exposed free ends 132 of the electrically conductive pillars 104. As can be taken from FIG. 23, the electrically conductive contact structure 130 is formed on a lower main surface of the structure shown in FIG. 22 by attaching a further electrically conductive layer structure such as a copper foil and patterning this electrically conductive layer structure. As can be taken from FIG. 23, the islands of the electrically conductive contact structure 130 contact a respective one of the traces 146 with a corresponding one of the pillars 104.

FIG. 24 to FIG. 30 illustrate cross-sectional views of structures obtained during performance of a method of manufacturing a component carrier 100, shown in FIG. 30, according to another exemplary embodiment of the invention.

In order to obtain the structure shown in FIG. 24, a similar process can be carried out which has been described above to obtain the structure shown in FIG. 18.

Figure 25:
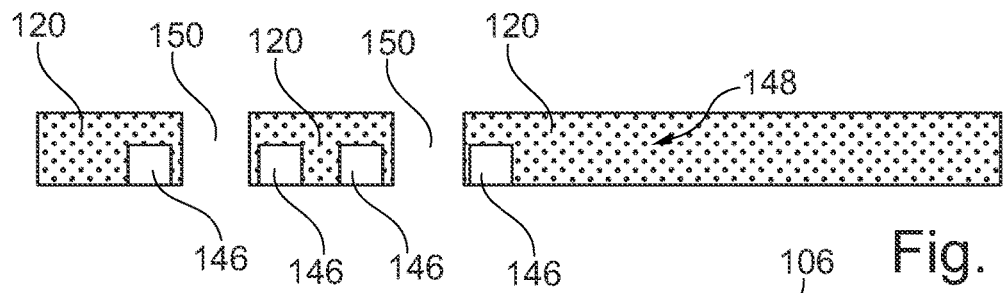

In order to obtain the structure shown in FIG. 25, a similar procedure can be carried out as described above referring to FIG. 19 and FIG. 20.

Figure 26:
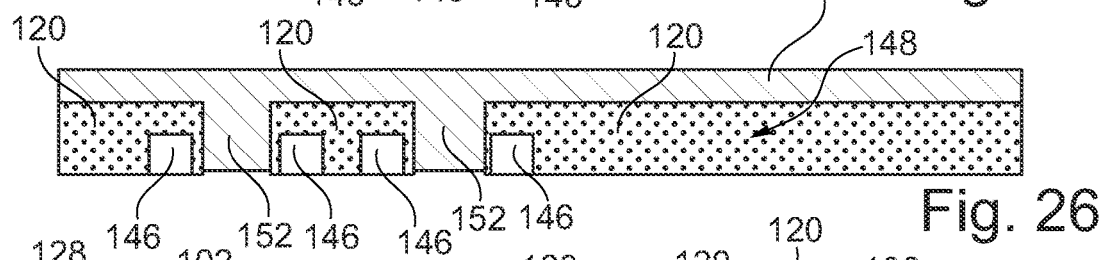

In order to obtain the structure shown in FIG. 26, a similar procedure may be carried out as described above referring to FIG. 21.

Figure 27:
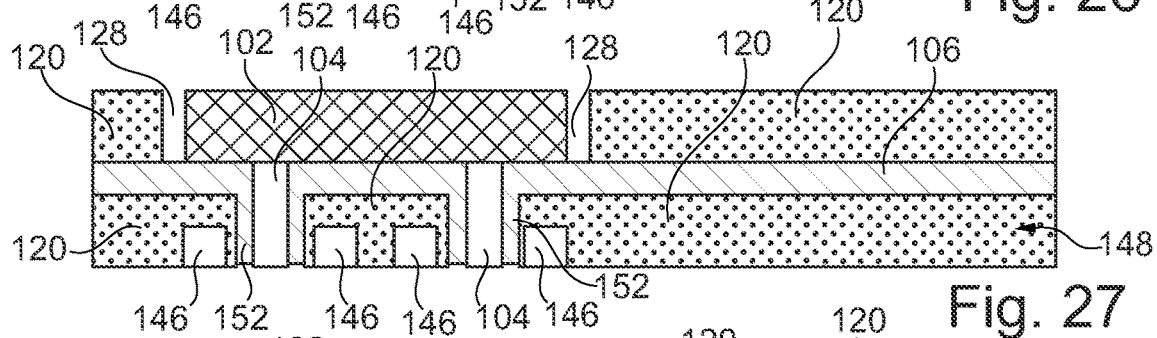

In order to obtain the structure shown in FIG. 27, a further electrically insulating layer structure is attached on top of the structure shown in FIG. 26. This further electrically insulating layer structure may be a core 120 of fully cured material, for instance a pre-cut FR4 core 120. A cavity 128 of this core 120 may be dimensioned for accommodating the component 102 shown in FIG. 27. When accommodated in the cavity 128 of the core 120, the pillars 104 protruding from a lower main surface of the component 102 are inserted into the protrusions 152 of the electrically insulating layer structure 106.

Figure 28:
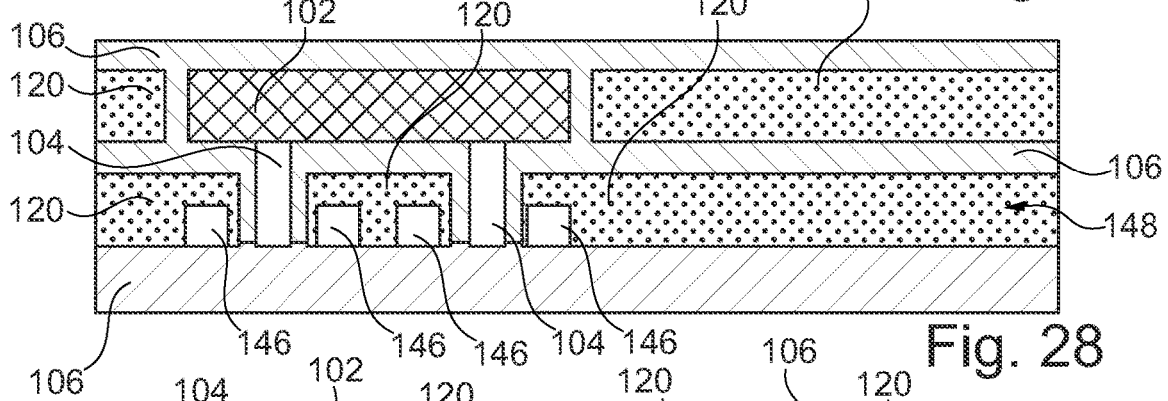

In order to obtain the structure shown in FIG. 28, further electrically insulating layer structures 106 may be attached to an upper and lower main surface of the structure shown in FIG. 27 and may be interconnected with the structure shown in FIG. 27 by lamination, i.e. the application of pressure and/or heat. Thereby, also the remaining gaps of the cavity 128 are filled with dielectric material.

Figure 29:
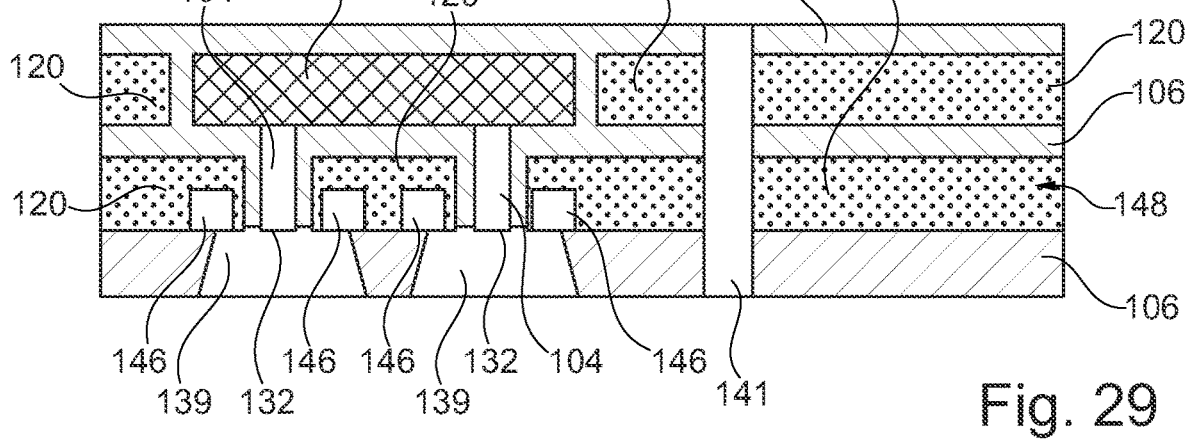

In order to obtain the structure shown in FIG. 29, laser drilling may be carried out in order to form laser holes 139 exposing traces 146 and free ends 132 of the pillars 104. Moreover, a mechanical drilling procedure may be carried out for forming a vertical through-hole 141 extending through the entire interconnected layer stack shown in FIG. 29.

Referring to FIG. 30, the respective holes 139, 141 are filled partly or entirely with electrically conductive material 112 (for instance by performance of a copper plating procedure) to thereby contact the respective electrically conductive pillars 104 with respective ones of the traces 146 and to establish a vertical electrically conductive interconnection between the two opposing main surfaces of the component carrier 100. Thus, in order to obtain the component carrier 100 shown in FIG. 30, the laser holes 139 and the mechanical drill hole 141 are filled with electrically conductive material such as copper. As a result, an electrically conductive contact structure 130 is formed interconnecting the traces 146 with the pillars 104 and interconnecting different layers of the layer stack of the component carrier 100. One or more further electrically conductive layer structures 108 and/or electrically insulating layer structures 106 may be laminated on the upper and/or the lower main surface of the component carrier 100.

Figure 37:
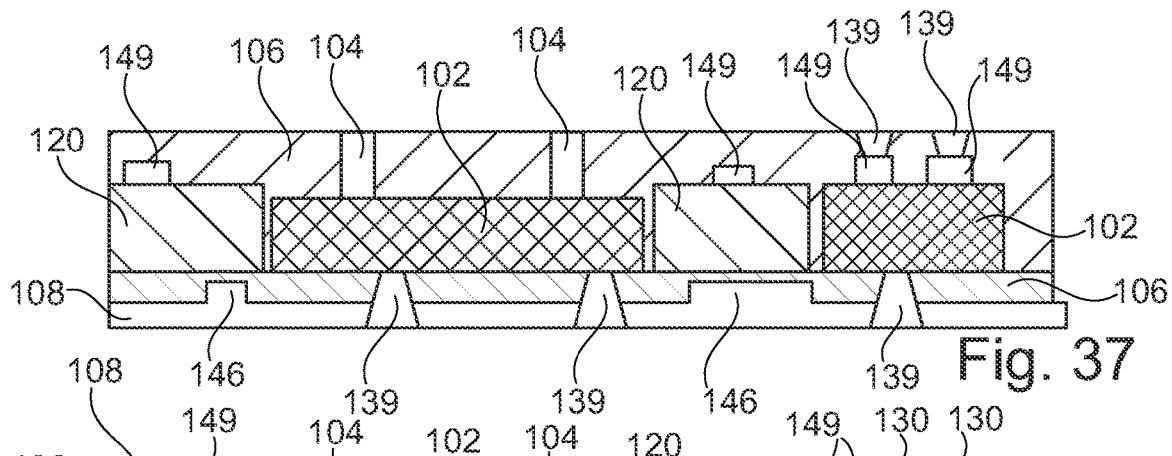
Figure 38:
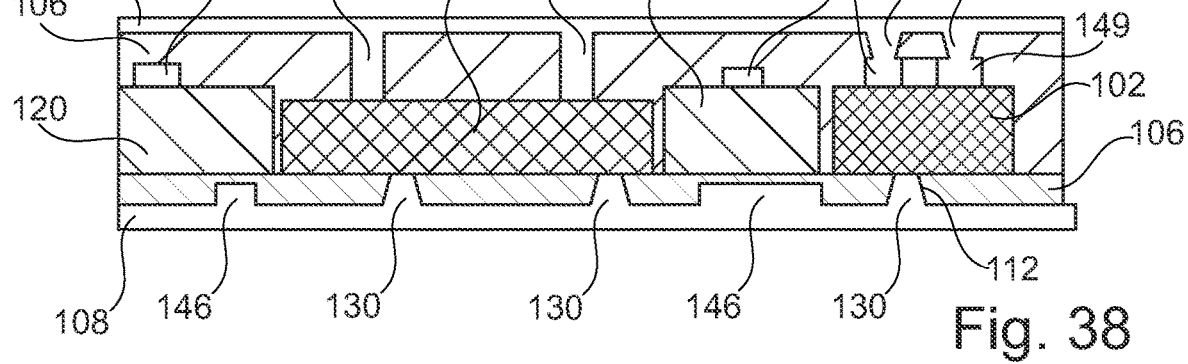
Figure 39:
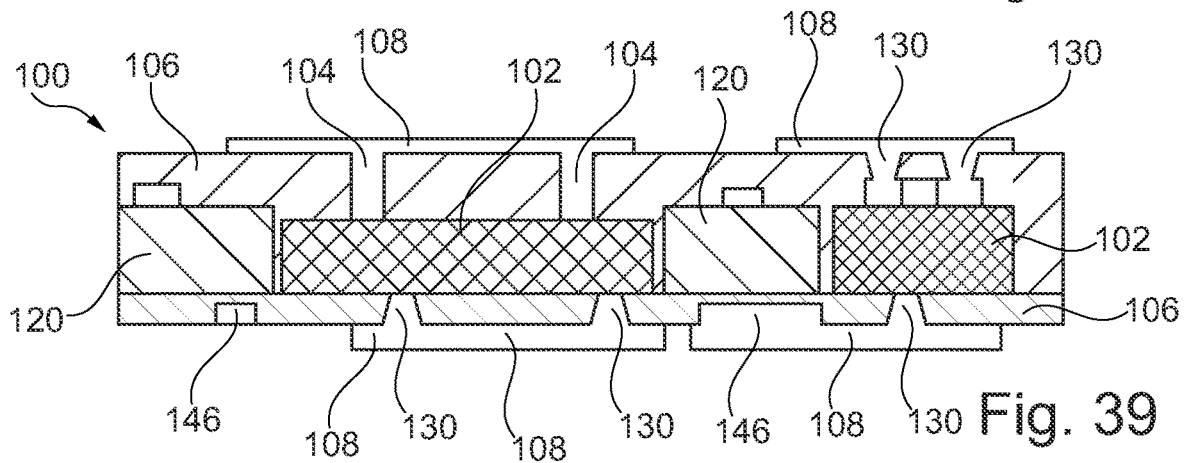

FIG. 31 to FIG. 39 illustrate cross-sectional views of structures obtained during performance of a method of manufacturing a component carrier 100, shown in FIG. 39, according to another exemplary embodiment of the invention.

With regard to the layer structures shown in FIG. 31 and FIG. 32, reference is made to the above description of the manufacturing process according to FIGS. 17 and 18.

In order to obtain the structure shown in FIG. 33, a resin layer is attached as electrically insulating layer structure 106 to the upper main surface of the structure shown in FIG. 32 to thereby form a layer without surface profile.

As can be taken from FIG. 34, a pre-cut core 120 is then mounted on the structure shown in FIG. 32, and components 102 may be assembled in corresponding recesses of the core 120. Electrically conductive traces 149 may be formed or provided on top of the core 120 as well as on top of the component 102 shown on the right-hand side of FIG. 34. The component 102 having pillars 104 is placed face up in a corresponding recess of the core 120, i.e. so that the pillars 104 protrude upwardly according to FIG. 34.

Referring to FIG. 35, a subsequent inserting procedure is accomplished by moving an electrically insulating layer structure 106 into the stationary electrically conductive pillars 104 protruding upwardly from the component 102. FIG. 35 shows what is obtained when electrically insulating layer structure 106 is attached to an upper main surface of the structure shown in FIG. 34 and is interconnected by lamination, i.e. the application of heat and/or pressure.

Figure 36:
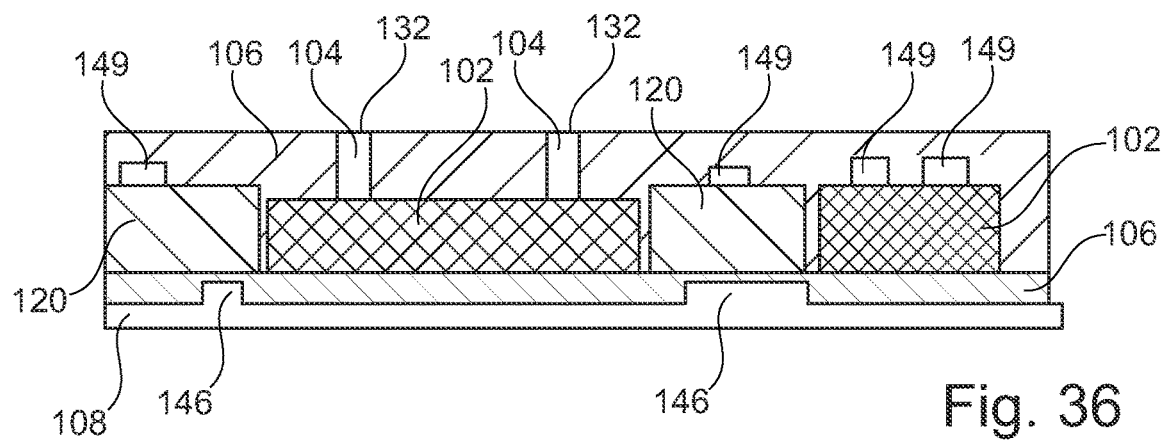

By removing surface material of the electrically insulating layer structure 106 on the upper main surface of the structure shown in FIG. 35 by a plasma treatment, the structure shown in FIG. 36 is obtained. Free ends 132 of the pillars 104 are now exposed to an environment.

In order to obtain the structure shown in FIG. 37, laser via holes 139 are drilled in both opposing main surfaces of the structure shown in FIG. 36 to thereby expose embedded electrically conductive structures of the structure shown in FIG. 36. The exposed electrically conductive structures are traces 149 on one of the components 102, as well as pads (not shown) on the lower main surfaces of the components 102.

In order to obtain the structure shown in FIG. 38, the laser vias 139 are filled with electrically conductive material such as copper, for instance by plating. Also, electrically conductive layer structures 108 are formed on both opposing main surfaces of the structure shown in FIG. 38 as a result of the plating or by attaching additional copper foils.

In order to obtain the component carrier 100 shown in FIG. 39, the electrically conductive layer structures 108 on both opposing main surfaces of the structure shown in FIG. 38 are patterned to form corresponding electrically conductive contact structures 130 of the component carrier 100.

Figure 44:
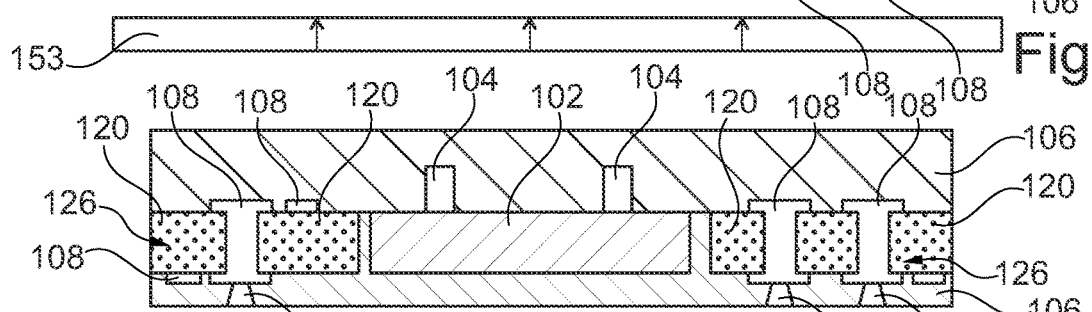
Figure 45:
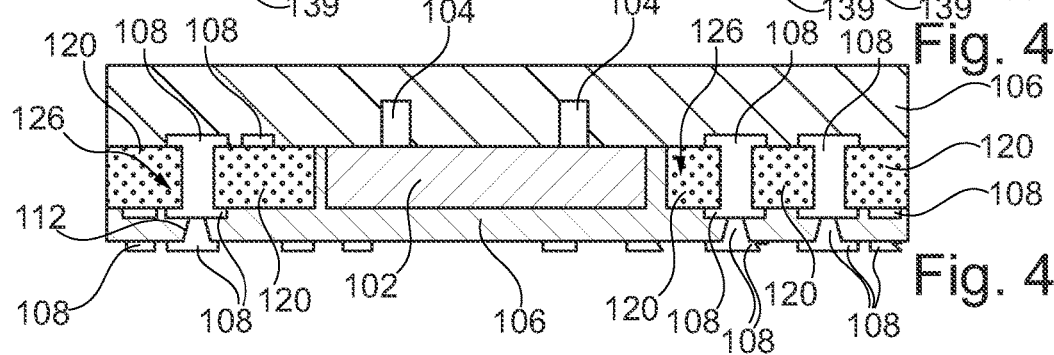
Figure 46:
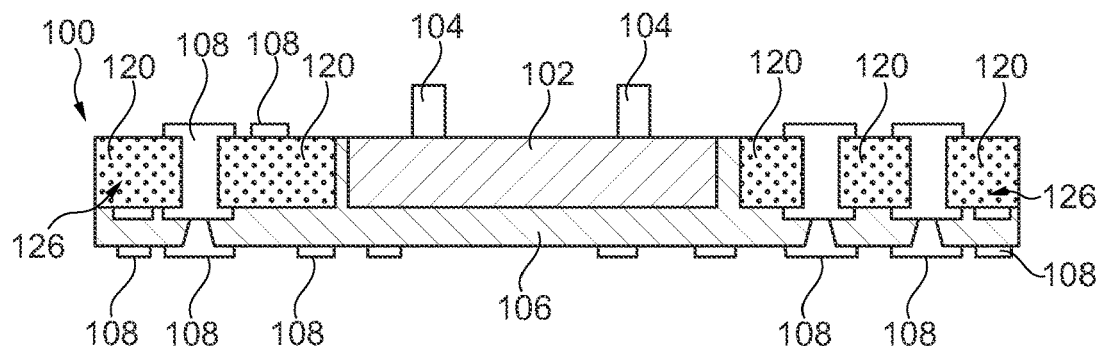

FIG. 40 to FIG. 46 illustrate cross-sectional views of structures obtained during performance of a method of manufacturing a component carrier 100, shown in FIG. 46, according to another exemplary embodiment of the invention.

Figure 40:
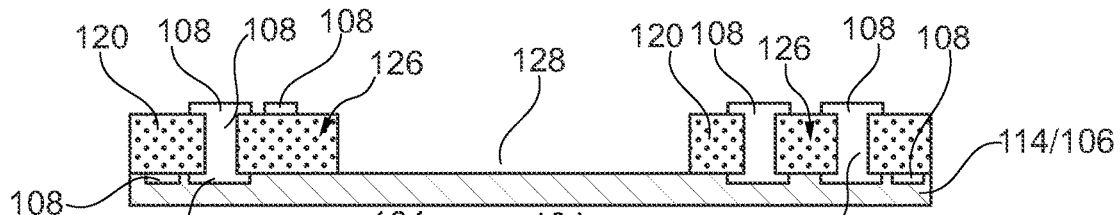
FIG. 40, FIG. 41, FIG. 42, FIG. 43, FIG. 44, FIG. 45 and FIG. 46 illustrate cross-sectional views of structures obtained during performance of a method of manufacturing a component carrier, shown in FIG. 46, according to another exemplary embodiment of the invention.

The embodiment shown in FIG. 40 starts with a carrier 114 on which a pre-cut core 120 is placed, which defines a central cavity 128. Electrically conductive layer structures 108 are also shown in FIG. 40. The carrier 114 may be a temporary carrier which is later removed (and which may for instance be substituted by an uncured electrically insulating layer structure 106 for lamination), or may be a permanent carrier composed of an uncured electrically insulating material such as resin or prepreg and thereby forming the electrically insulating layer structure 106.

Figure 41:

In order to obtain the structure shown in FIG. 41, component 102 with pillars 104 is placed in the cavity 128 in a way that the pillars 104 extend upwardly, i.e. protrude beyond the cavity 128.

Figure 42:
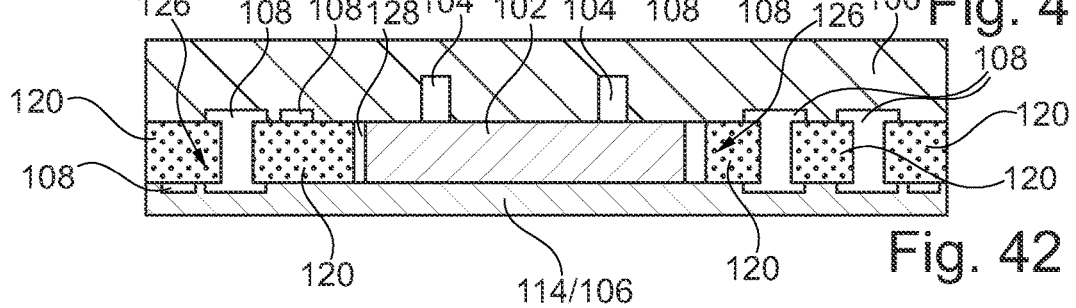
Figure 43:
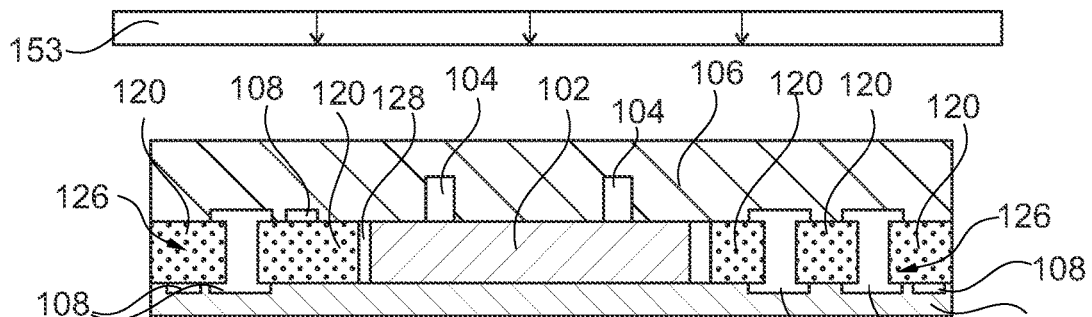

FIG. 42 now shows that an electrically insulating layer structure 106 is attached by lamination to an upper main surface of the structure shown in FIG. 41 and is thereby connected therewith. For instance, this electrically insulating layer structure 106 may be a high temperature stable photoresist configured for withstanding lamination temperatures of resin or prepreg without being damaged.

Gaps remain between the component 102 and the sidewalls of the core 120 in the cavity 128. As can be taken from FIG. 43, press plates 153 of a lamination apparatus are approached towards the structure shown in FIG. 42. If a cured temporary carrier 114 has been used in FIG. 40 (rather than an uncured electrically insulating layer structure 106), the temporary carrier 114 is now removed and substituted by an at least partially uncured electrically insulating layer structure 106 before lamination.

As can be taken from FIG. 44, the previously mentioned gaps of the cavity 128 are now filled with material of the previously uncured electrically insulating layer structure 106 which flows into these gaps during lamination at elevated temperature. Thanks to the implementation of a high temperature stable photoresist as upper electrically insulating layer structure 106, the latter remains intact during this lamination procedure.

Furthermore, FIG. 44 shows that, after the lamination, laser holes 141 are drilled through a lower main surface portion of the structure shown in FIG. 44 to expose electrically conductive layer structures 108 in an interior of the structure shown in FIG. 44.

As can be taken from FIG. 45, the laser holes 141 are filled with electrically conductive material such as copper, for instance by plating. Further electrically conductive layer structures 108 may be formed, for instance by performance of an SAP (semi-additive processing) process.

Referring to FIG. 46, the (in the shown embodiments temporary) electrically insulating layer structure 106 can be removed from an upper main surface of the structure shown in FIG. 45 and hence from the component 102 and the electrically conductive pillars 104 which are thereby exposed. Hence, the high temperature stable photoresist in form of the electrically insulating layer structure 106 on the upper main surface of the structure shown in FIG. 45 may then be removed, for instance may be stripped. This exposes also the pillars 104 which are thereby accessible for being connected to an electronic periphery.

Figure 47:
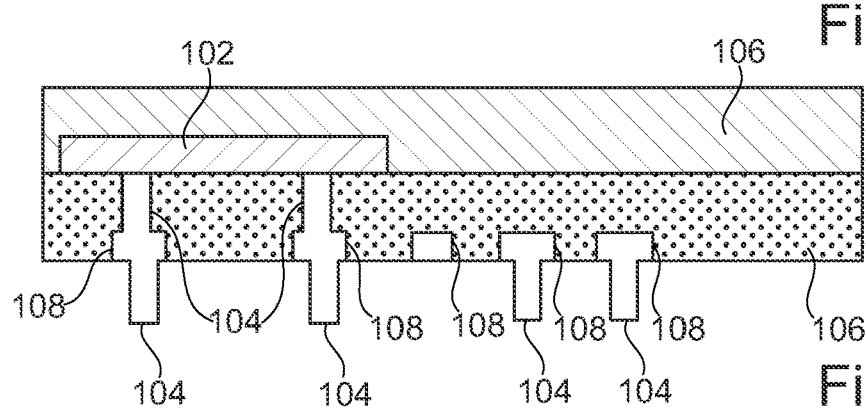
FIG. 47 illustrates a cross-sectional view of a structure obtained during performance of a method of manufacturing a component carrier according to another exemplary embodiment of the invention.

FIG. 47 illustrates a cross-sectional view of a structure obtained during performance of a method of manufacturing a component carrier 100 according to another exemplary embodiment of the invention. In this embodiment, the method comprises forming, for instance by galvanic depositing, further electrically conductive pillars 104 on the electrically conductive pillars 104 of the component 102. The embodiment of FIG. 47 shows that a vertical stack of pillars 104 may be formed. In other words, embedded pillars 104 of a component 102 may be further interconnected to further pillars 104 formed thereon.

Figure 48:
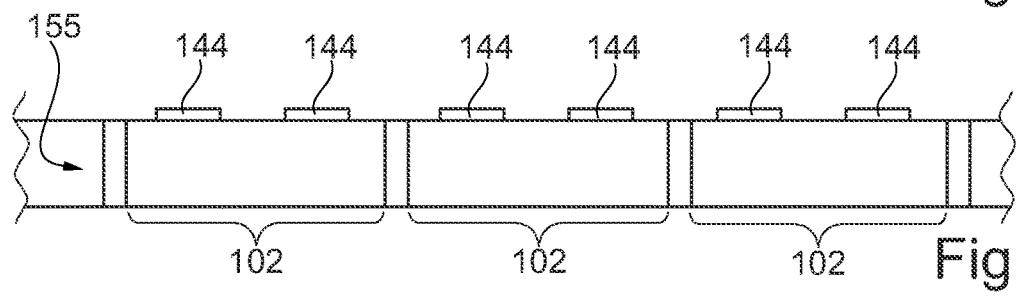
FIG. 48, FIG. 49 and FIG. 50 illustrate cross-sectional views of structures obtained during forming pillars on components on wafer level according to an exemplary embodiment of the invention.
Figure 49:
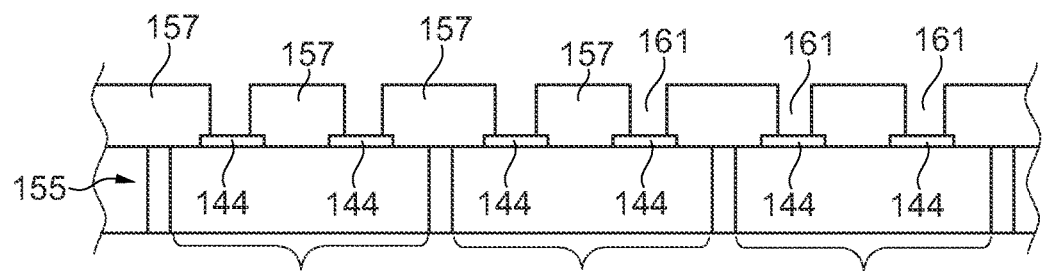
Figure 50:
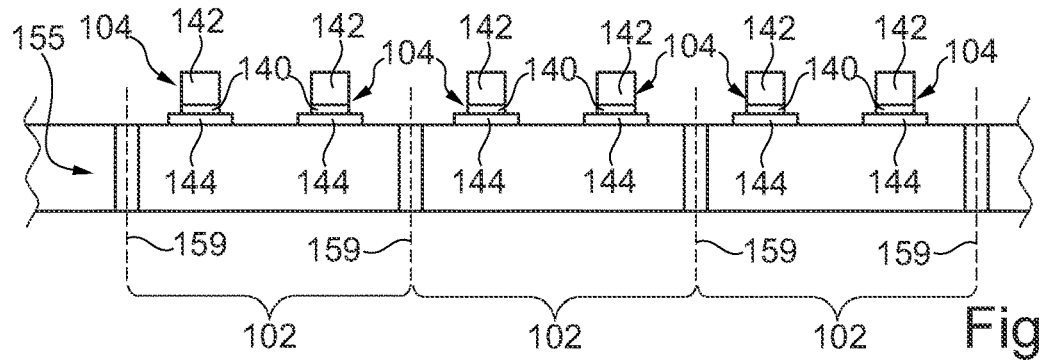

FIG. 48 to FIG. 50 illustrate cross-sectional views of structures obtained during forming pillars 104 on components 102 on wafer level according to an exemplary embodiment of the invention.

FIG. 48 shows a semiconductor wafer 155 (for instance a silicon wafer) having chip sections (with monolithically integrated circuit elements, such as field-effect transistors, in accordance with the electronic function of the respective component 102) corresponding to later singularized components 102. Pads 144 are formed in the shown embodiment on the upper main surface of the wafer 155, wherein a respective set of pads 144 is assigned to each portion of the wafer 155 which is later singularized into a respective component 102. For example, the pads 144 may be made of copper and/or aluminum.

FIG. 49 shows that a layer of photoresist 157 has been applied to an upper main surface of the structure shown in FIG. 48 and has been patterned photolithographically. As a result, portions of the pads 144 are exposed to an environment in recesses 161.

Referring to FIG. 50, the electrically conductive pillars 104 are formed simultaneously in a batch procedure for a plurality of integrally connected components 102 embodied as semiconductor chips on wafer level. This is accomplished by a sputtering procedure for forming base portions 140 of copper-titanium followed by a galvanic deposition procedure for forming the top portions 142 of copper. Due to the patterning of the photoresist 157, the positions of the pillars 104 may be precisely defined. The height of the pillars 104 may be accurately defined by the design of the galvanic deposition procedure as well as by the thickness of the photoresist 157. After formation of the pillars 104, the photoresist 157 may be removed by stripping.

Subsequently, the individual components 102 are singularized from the wafer compound so that each of the obtained individual components 102 is provided with a subset of the electrically conductive pillars 104. Hence, as indicated by separation lines 159, the processed wafer 155 with the already formed pillars 104 may be singularized into the individual components 102 with pre-formed pillars 104, for instance by mechanically sawing, chemically etching or laser separation.

FIG. 51 to FIG. 57 illustrate cross-sectional views of structures obtained during performance of a method of manufacturing a component carrier 100, shown in FIG. 57, according to another exemplary embodiment of the invention. What concerns the embodiment shown in FIG. 51 to FIG. 57, reference is made to the similar embodiment described above referring to FIG. 40 to FIG. 46.

In particular, the structure shown in FIG. 51 can be obtained correspondingly to the description of FIG. 40.

However, as can be taken from FIG. 52, in this embodiment the component 102 with the pillars 104 is placed in the cavity 128 face down rather than face up, i.e. with the pillars 104 extending into the temporary carrier 114. Preferably, the thickness of the core 120 may be smaller than or equal to the thickness of the component 102.

After covering the upper main surface of the structure shown in FIG. 53 with an electrically insulating layer structure 106 and lamination, the temporary carrier 114 may be removed from a bottom main surface of the obtained structure, see FIG. 54.

As illustrated in FIG. 53, a carrier body is composed of core 120 and electrically conductive layer structure 108 which delimit the cavity 128. In FIG. 53, the electrically conductive layer structure 108 forms part of the surface of the carrier body 108, 120 (being already covered with a respective electrically insulating layer structure 106 on both opposing main surfaces thereof). The component 102 with the pillars 104 it is arranged in the cavity 128, as illustrated in FIG. 52. Advantageously, the lower electrically insulating layer structure 106 in FIG. 53 accommodates the pillars 104. However, as can be taken from FIG. 53 and FIG. 54, the pillars 104 extend, in a downward direction, vertically beyond the electrically conductive layer structures 108 of the carrier body 108, 120. As a result, contacting the component 102 via the excessively protruding pillars 104 is significantly simplified (see also the readily manufactured component carrier 100 shown in FIG. 57).

As a result, the pillars 104 are now exposed. As shown in FIG. 55, an electrically insulating layer structure 106 may then be provided at a bottom side and interconnected with the structure shown in FIG. 54 to at least partially cover the pillars 104.

Thereafter, laser holes 141 may be drilled on both opposing main surfaces of the structure shown in FIG. 56 to thereby expose previously embedded electrically conductive layer structures 108.

As can be taken from FIG. 57, these laser holes 141 may be filled with electrically conductive material, for instance by plating. Furthermore, electrically conductive layer structures 108 may be formed as electrically conductive contact structures 130 on both opposing main surfaces of the component carrier 100 shown in FIG. 57, for instance patterned copper foils.

Figure 63:
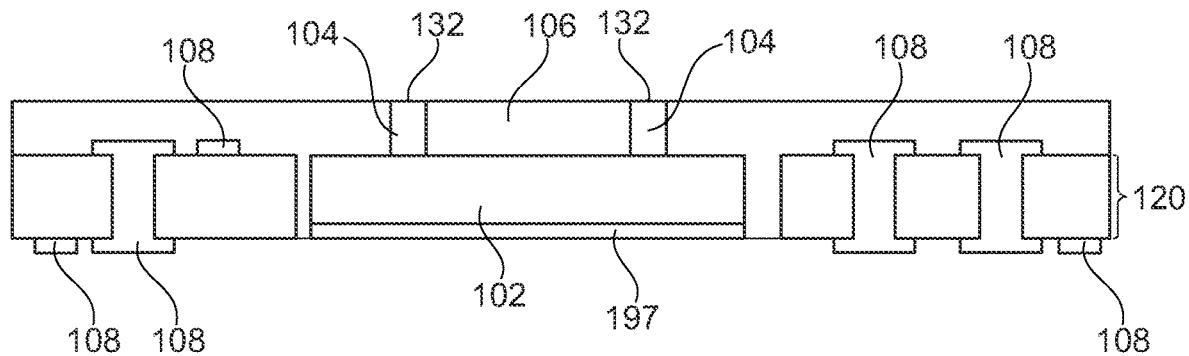
Figure 64:
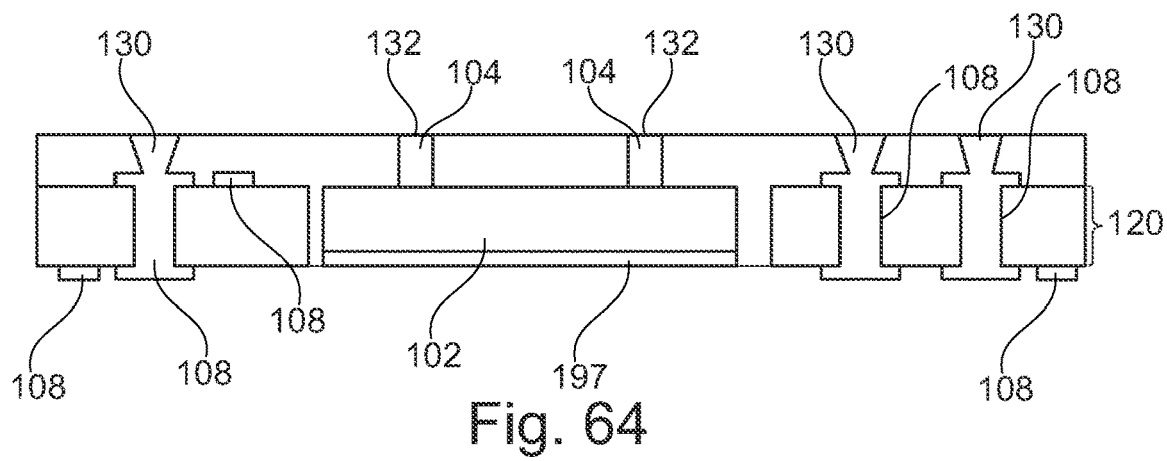
Figure 65:
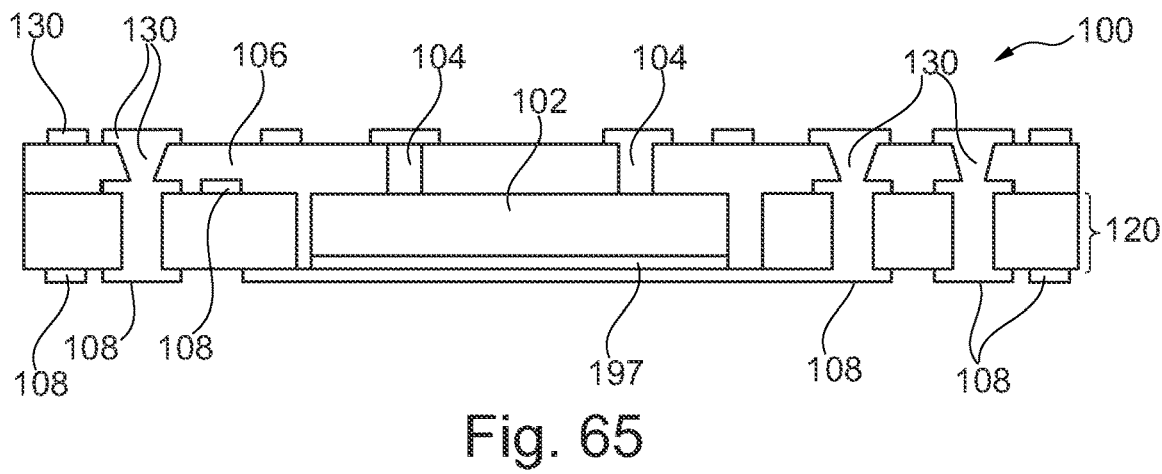

FIG. 58 to FIG. 65 illustrate cross-sectional views of structures obtained during performance of a method of manufacturing a component carrier 100, shown in FIG. 65, according to another exemplary embodiment of the invention.

Figure 58:
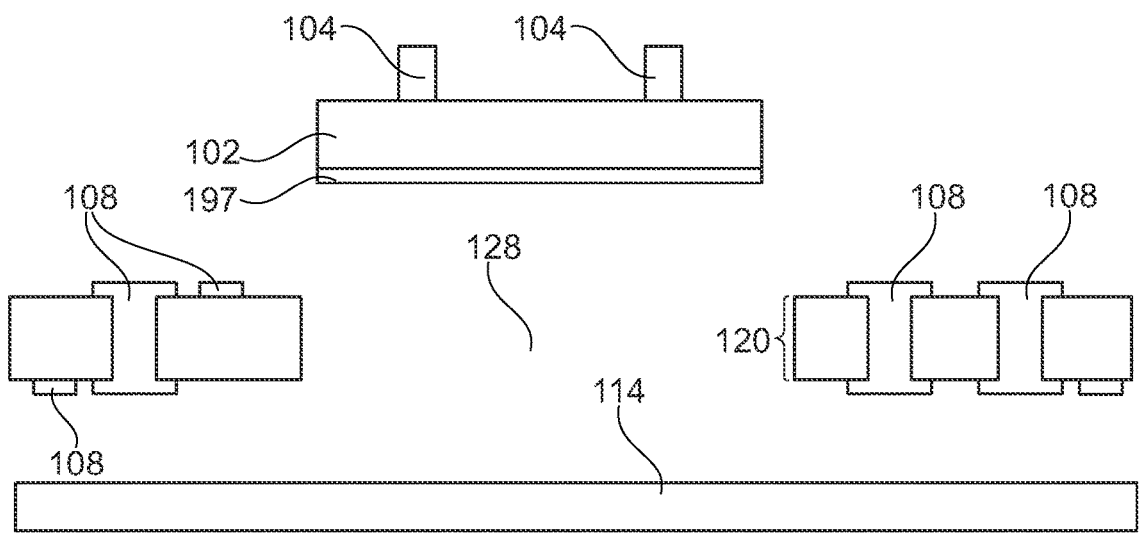
FIG. 58, FIG. 59, FIG. 60, FIG. 61, FIG. 62, FIG. 63, FIG. 64 and FIG. 65 illustrate cross-sectional views of structures obtained during performance of a method of manufacturing a component carrier, shown in FIG. 65, according to another exemplary embodiment of the invention.

In order to obtain the structure shown in FIG. 58, a component 102 comprising pillars 104 on one main surface and comprising a pad 197 on the opposing other main surface is provided. A core 120 having a through hole type central recess as cavity 128 is provided as well with pillars 104 in a face up configuration. A temporary carrier 114, for instance a sticky tape, is provided as well.

Figure 59:
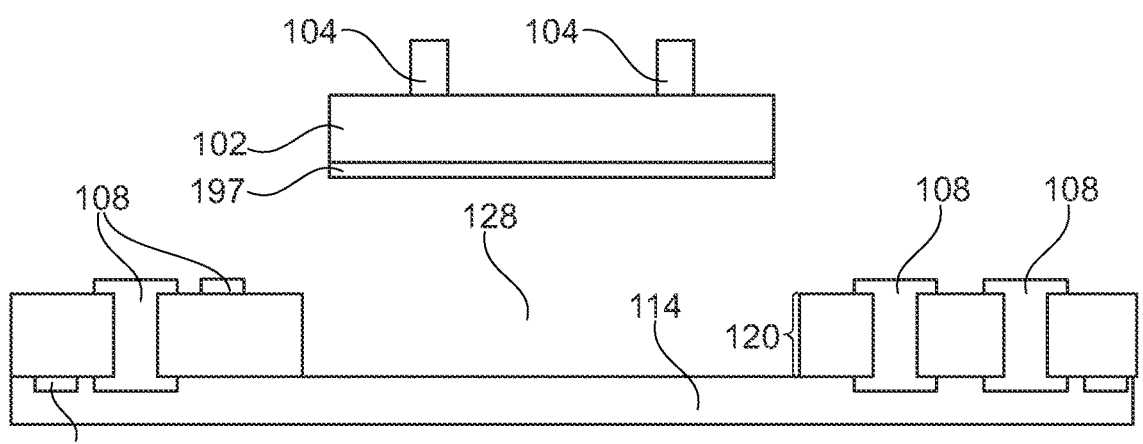

In order to obtain the structure shown in FIG. 59, the core 120 is attached to an adhesive surface of the temporary carrier 114.

Figure 60:
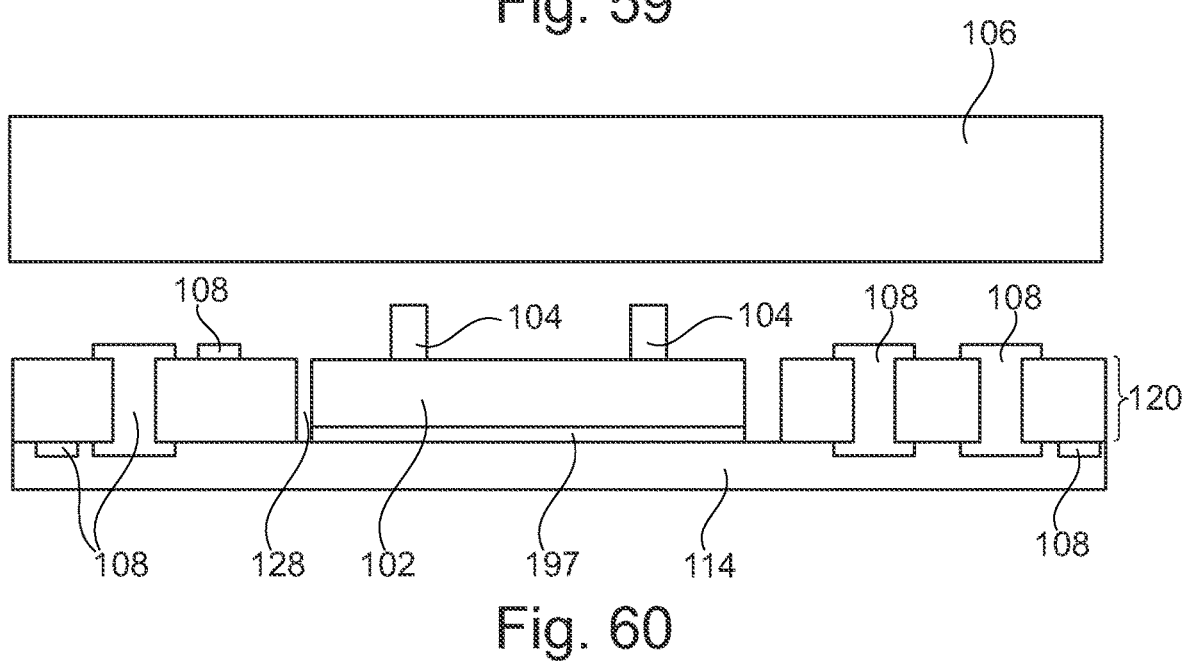

In order to obtain the structure shown in FIG. 60, the component 102 is inserted into the cavity 128 and is attached to a sticky upper surface of the temporary carrier 114 so that there is a direct physical contact between the pad 197 and the temporary carrier 114. An at least partially uncured electrically insulating layer structure 106, for instance a resin sheet or a prepreg sheet, is placed above the mentioned constituents in preparation of the subsequent procedures.

Figure 61:
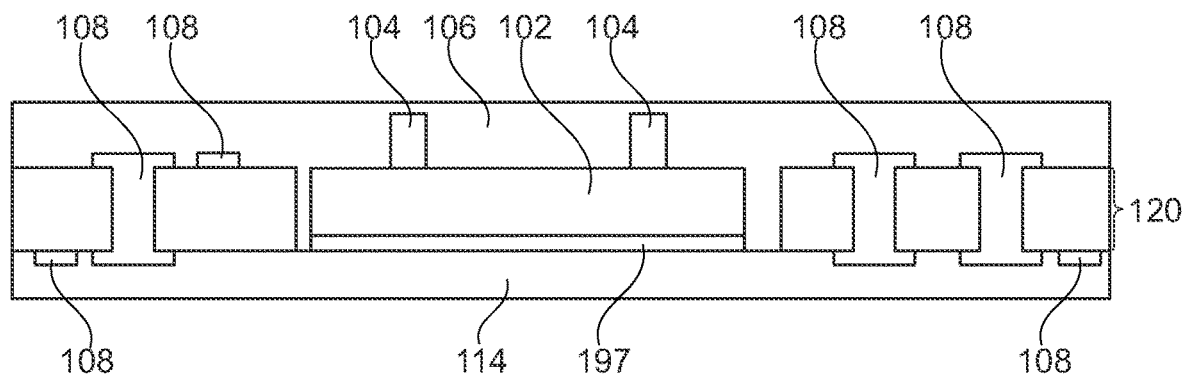

In order to obtain the structure shown in FIG. 61, the at least partially uncured electrically insulating layer structure 106 is laminated onto the core 120 and the component 102 including the pillars 104 so as to form an integral structure. During lamination by applying heat and pressure, the uncured material of layer structure 106 is cured and hardened.

Figure 62:
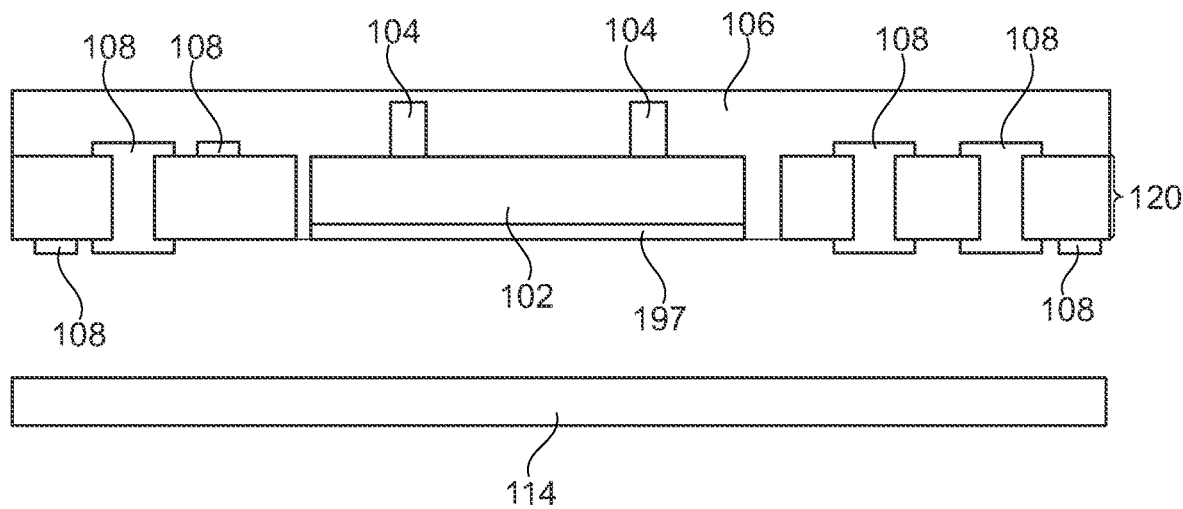

In order to obtain the structure shown in FIG. 62, the temporary carrier 114 is removed from the structure obtained according to FIG. 61, for instance may be peeled off. Since the material of the previously uncured layer structure 106 is now cured and hardened, mechanical support provided by the temporary carrier 114 is no longer necessary.

In order to obtain the structure shown in FIG. 63, the upper main surface of the structure shown in FIG. 62 is made subject to a plasma treatment (or any other material removal procedure) to remove a surface portion of the now cured layer structure 106 to expose the free ends 132 of the pillars 104.

In order to obtain the structure shown in FIG. 64, laser via holes are drilled and are at least partially filled with electrically conductive material (for instance are plated with copper) to thereby form electrically conductive contact structure 130.

In order to obtain the component carrier 100 shown in FIG. 65, electrically conductive layer structures may be attached to both opposing main surfaces of the structure shown in FIG. 64 and are patterned to thereby form further constituents of the electrically conductive contact structure 130. The illustrated component carrier 100 is appropriate for power applications with power components 102 (such as MOSFETs).

Figure 71:
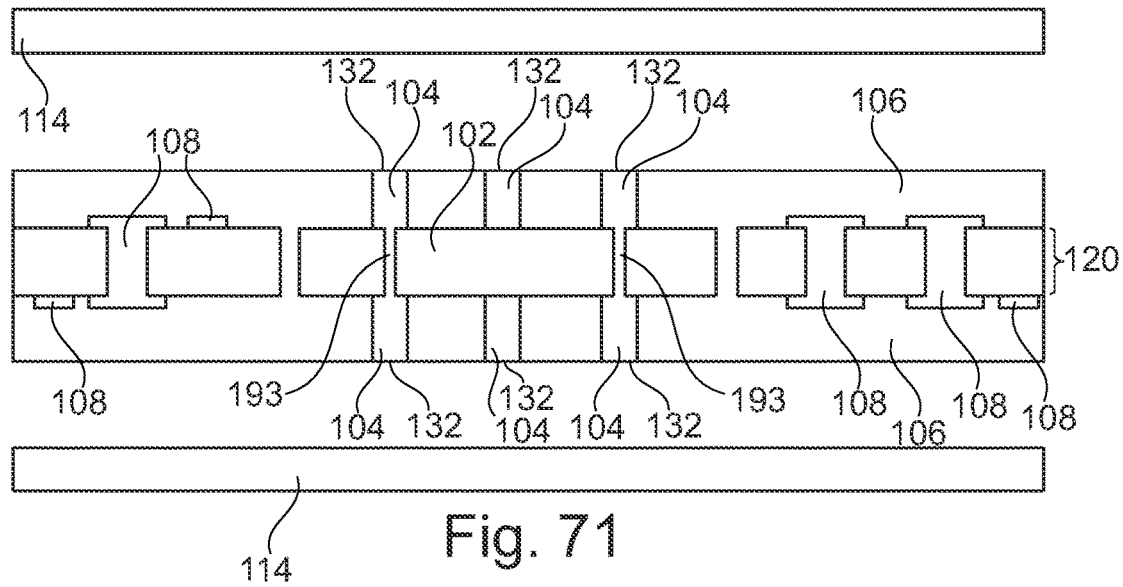
Figure 72:
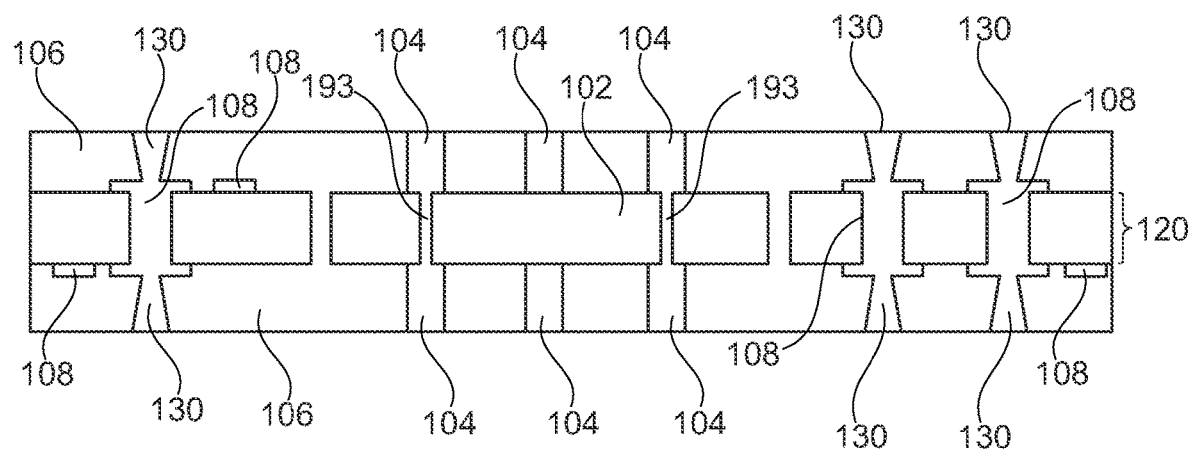
Figure 73:
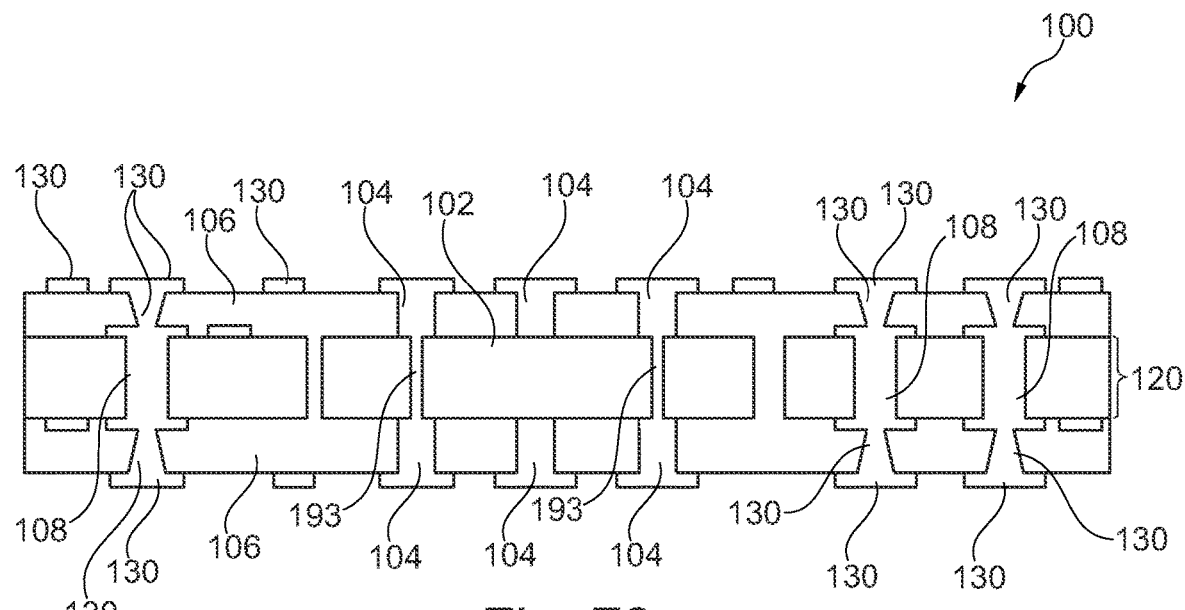

FIG. 66 to FIG. 73 illustrate cross-sectional views of structures obtained during performance of a method of manufacturing a component carrier 100, shown in FIG. 73, according to another exemplary embodiment of the invention.

Figure 66:
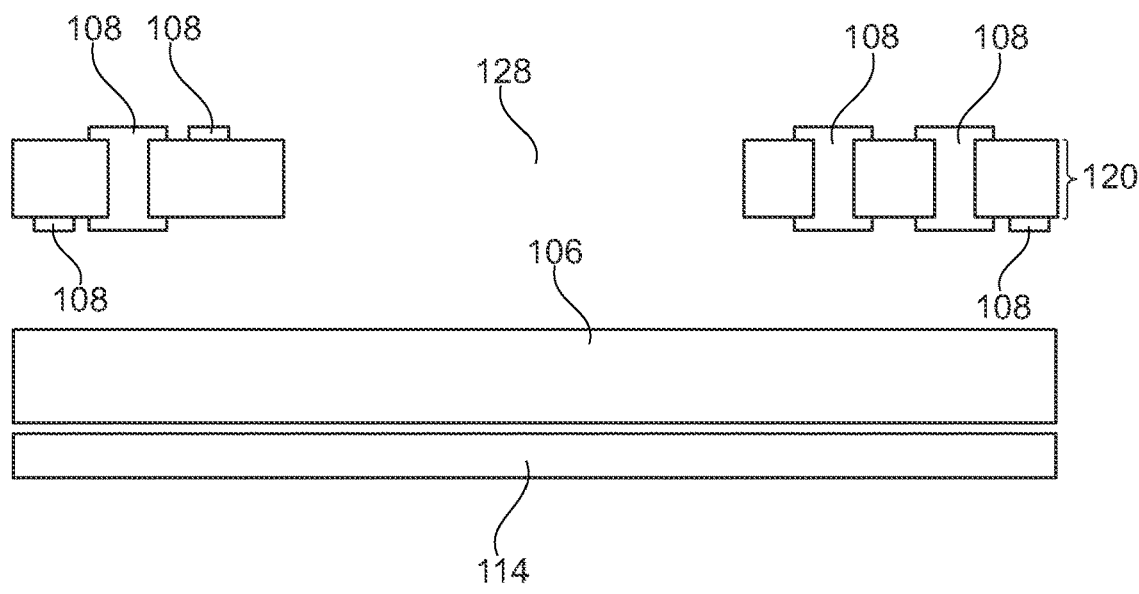
FIG. 66, FIG. 67, FIG. 68, FIG. 69, FIG. 70, FIG. 71, FIG. 72 and FIG. 73 illustrate cross-sectional views of structures obtained during performance of a method of manufacturing a component carrier, shown in FIG. 73, according to another exemplary embodiment of the invention.

In order to obtain the structure shown in FIG. 66, a fully cured core 120 with a cavity 128 for accommodating a component 102 is placed above a continuous resin sheet as uncured electrically insulating layer structure 106, which is, in turn, placed above a temporary carrier 114 such as a sticky foil.

Figure 67:
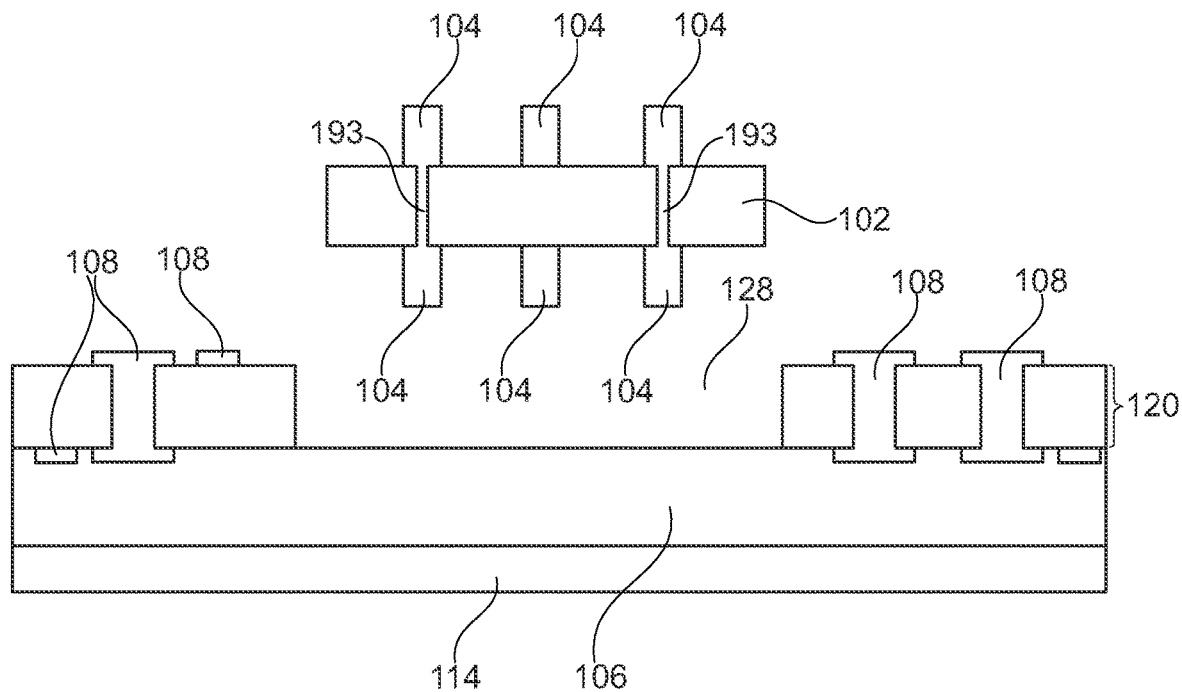

In order to obtain the structure shown in FIG. 67, a component 102 having a regular array of pillars 104 extending beyond both opposing main surfaces of the component 102 is arranged above the cavity 128. As can be taken from FIG. 67, at least a part of the pillars 104 on the opposing main surfaces of the component 102 are connected by electrically conductive connections 193 extending through the component 102, so as to be electrically coupled with one another.

Figure 68:
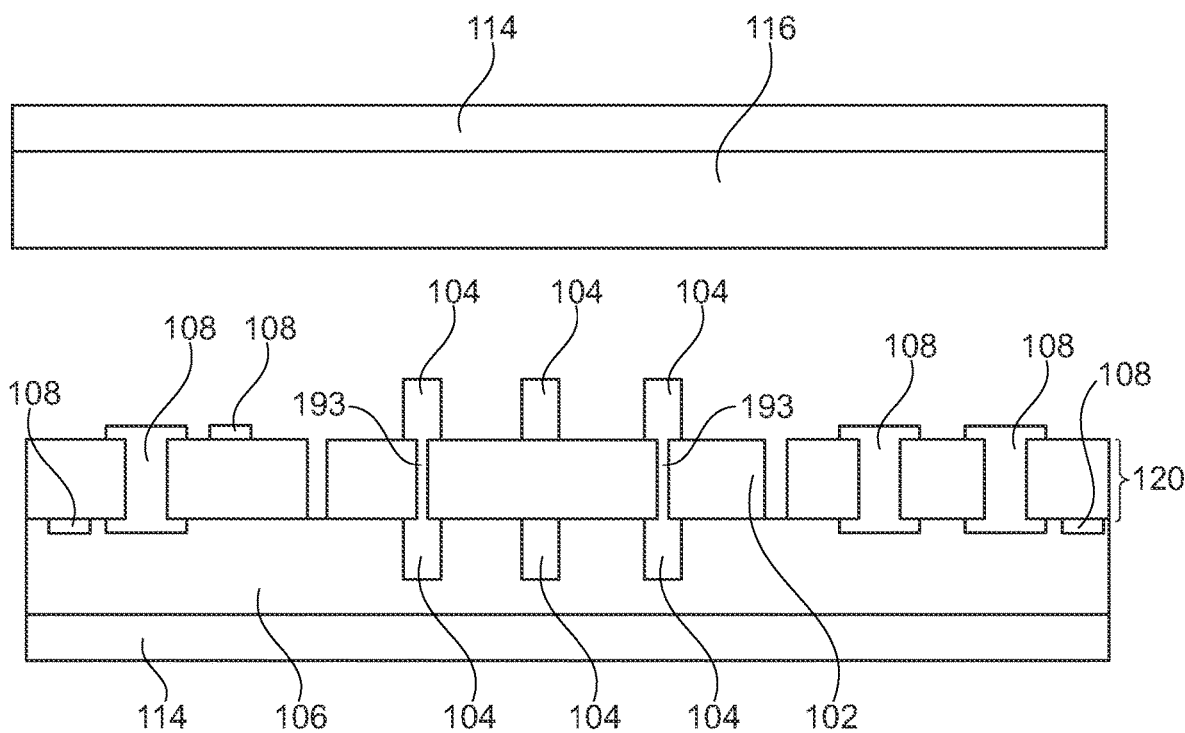

In order to obtain the structure shown in FIG. 68, the component 102 is placed in the cavity 128 so that the pillars 104 on the lower main surface of the component 102 extend into the electrically insulating layer structure 106. In contrast to this, the pillars 104 on the upper main surface of the component 102 protrude upwardly. As shown in FIG. 68 as well, a further electrically insulating layer structure 106 on a further temporary carrier 114 may be arranged above the structure described before.

Figure 69:
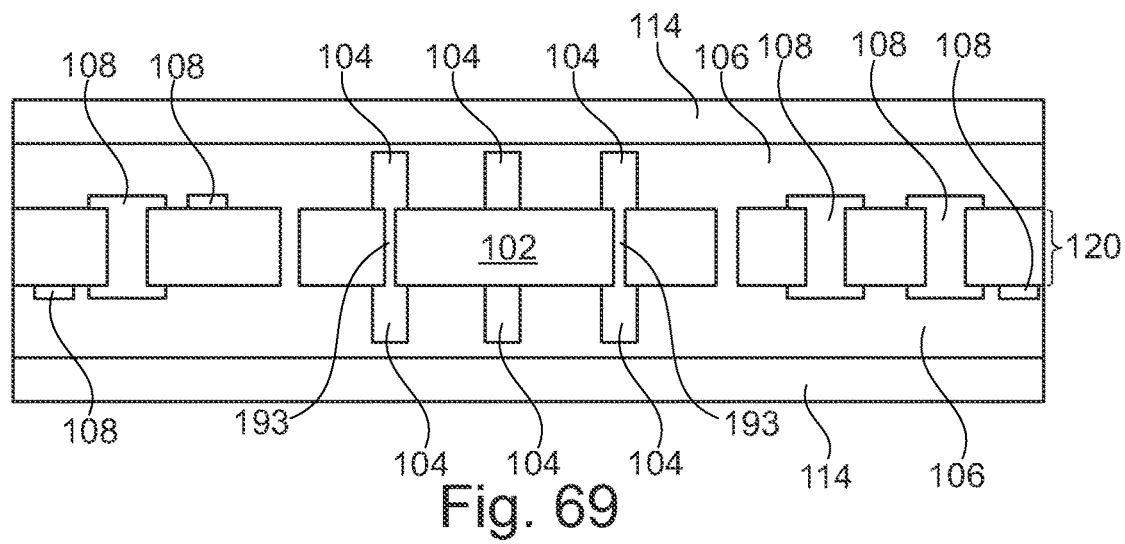

In order to obtain the structure shown in FIG. 69, the further electrically insulating layer structure 106 on the further temporary carrier 114 are lowered so that the exposed pillars 104 on the upper main surface of the component 102 protrude into the further electrically insulating layer structure 106. The obtained constituents may be interconnected by lamination.

Figure 70:
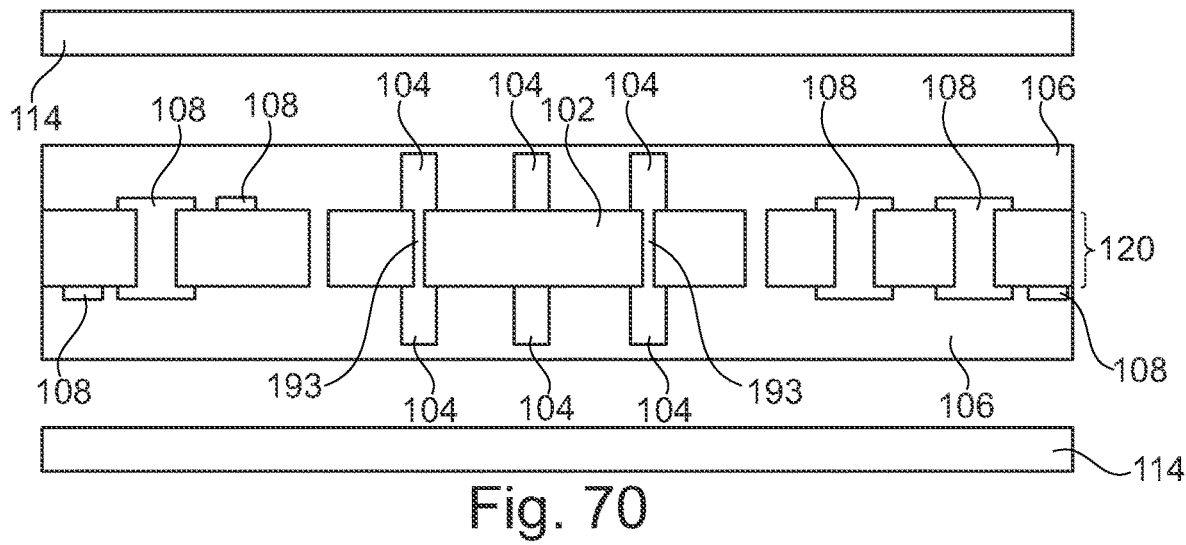

In order to obtain the structure shown in FIG. 70, the temporary carriers 114 are peeled off. In view of the lamination, the shown structure is now sufficiently rigid even without the supporting effect of the temporary carriers 114.

In order to obtain the structure shown in FIG. 71, both main surfaces of the structure shown in FIG. 70 are made subject to a plasma treatment (or any other material removal procedure) to remove a surface portion of the now cured respective layer structures 106 to expose the free ends 132 of the pillars 104.

In order to obtain the structure shown in FIG. 72, laser via holes are drilled and are at least partially filled with electrically conductive material (for instance a plated with copper) to thereby form electrically conductive contact structure 130.

In order to obtain the component carrier 100 shown in FIG. 73, electrically conductive layer structures may be attached to both opposing main surfaces of the structure shown in FIG. 72 and are patterned to thereby form further constituents of the electrically conductive contact structure 130. The illustrated component carrier 100 provides a high density interconnection and a double-sided interconnection.

It should be noted that the term "comprising" does not exclude other elements or steps and the "a" or "an" does not exclude a plurality. Also elements described in association with different embodiments may be combined.

Implementation of the invention is not limited to the example embodiments shown in the figures and described above. Instead, a multiplicity of variants is possible which use the solutions shown and the principle according to the invention even in the case of fundamentally different embodiments.

The invention claimed is:
1. A method of manufacturing a component carrier, the method comprising:
  galvanically depositing at least part of at least one electrically conductive pillar on a component;
  providing an electrically insulating layer structure, wherein the electrically insulating layer structure is a non-uniform electrically insulating layer structure having at least one protrusion for accommodating the at least one electrically conductive pillar; and
  after providing the electrically insulating layer structure, mechanically pressing the at least one electrically conductive pillar and the electrically insulating layer structure into one another, so that the at least one electrically conductive pillar is inserted into the electrically insulating layer structure so deep that a free end of the at least one electrically conductive pillar protrudes beyond the electrically insulating layer structure and is thereby exposed, wherein the inserting by mechanically pressing comprises one of moving the at least one electrically conductive pillar into the stationary electrically insulating layer structure, and moving the electrically insulating layer structure into the stationary at least one electrically conductive pillar;
  the component comprises a semiconductor chip being electrically contacted by a plurality of electrically conductive pillars;
  forming an electrically conductive trace structure, embedding the trace structure in a patterned electrically insulating matrix, the patterned electrically insulating matrix comprising a recess which is filled by the protrusion, attaching the electrically insulating layer structure to the matrix with embedded trace structure, and the inserting by mechanically pressing, and optionally fixing, the at least one electrically conductive pillar of the component into the electrically insulating layer structure extending into the recess of the matrix;

the component comprises the at least one electrically conductive pillar either on only one main surface thereof or on both opposing main surfaces thereof.

2. The method according to claim 1, further comprising at least one of the following features:
providing the component with a plurality of electrically conductive pillars arranged in a matrix pattern;
wherein the at least one electrically conductive pillar has an aspect ratio of at least 0.2;
wherein the at least one electrically conductive pillar comprises copper with a copper-titanium base portion and a copper top portion thereon;
wherein the at least one electrically conductive pillar is formed by sputtering a base portion of a first material on the component, and by galvanically depositing a top portion of a second material on the base portion;
wherein the component comprises at least one pad comprising of aluminum, on which the at least one electrically conductive pillar is formed;
wherein the method comprises galvanically depositing at least part of the at least one electrically conductive pillar for a plurality of integrally connected components embodied as semiconductor chips on a wafer level, and thereafter singularizing the components each of which being provided with at least one respective electrically conductive pillar;
providing the electrically insulating layer structure of an at least partially uncured material, and at least partially curing the at least partially uncured material of the electrically insulating layer structure during the inserting by mechanically pressing;
wherein the electrically insulating layer structure comprises a resin, prepreg, or a photoresist;
connecting at least one further electrically insulating layer structure made of an at least partially uncured material, with the component;
drilling at least one hole through at least one of the electrically insulating layer structure and the at least one further electrically insulating layer structure, and at least partially filling the at least one drilled hole with electrically conductive material to thereby contact at least one of the at least one electrically conductive pillar and the component.

3. The method according to claim 1, further comprising:
attaching a carrier to the electrically insulating layer structure prior to the inserting by mechanically pressing.

4. The method according to claim 3, further comprising at least one of the following features:
removing at least part of the attached carrier from the electrically insulating layer structure after the inserting by mechanically pressing;
wherein the carrier comprises at least one of the group consisting of a core, a core covered with at least one electrically conductive layer structure, a thinner electrically conductive layer on a thicker electrically conductive layer, and a plastic layer;
wherein the carrier comprises at least one recess aligned with the at least one electrically conductive pillar so that during the inserting by mechanically pressing, the at least one pillar is inserted into the at least one recess.

5. The method according to claim 1, further comprising at least one of the following features:
providing an accommodation structure with a cavity, and arranging the component in the cavity during the procedure of the inserting by mechanically pressing;
wherein the at least one electrically conductive pillar has an extension in an inserting direction in a range between 5 µm and 80 µm;
wherein the electrically insulating layer structure has a thickness in a range between 5 µm and 80 µm;
wherein the electrically insulating layer structure is a continuous electrically insulating layer structure being at least partially penetrated by the at least one electrically conductive pillar.

6. The method according to claim 1, wherein the method comprises the inserting by mechanically pressing the at least one electrically conductive pillar into the at least one protrusion.

7. The method according to claim 1, further comprising at least one of the following features:
forming at least one electrically conductive contact structure electrically contacting the at least one electrically conductive pillar with at least one further electrically conductive pillar;
wherein the method comprises the inserting by mechanically pressing the at least one electrically conductive pillar in the electrically insulating layer structure by applying pressure in a range between 2 bar and 15 bar;
wherein the method comprises the inserting by mechanically pressing the at least one electrically conductive pillar in the electrically insulating layer structure at a temperature in a range between 50° C. and 150° C.

8. The method according to claim 1, further comprising:
the inserting by mechanically pressing the at least one electrically conductive pillar into the electrically insulating layer structure so that a free end of the at least one electrically conductive pillar remains within the electrically insulating layer structure; and
subsequently removing part of the electrically insulating layer structure so that the free end is exposed.

9. The method according to claim 8, wherein the removing includes at least one of the group consisting of a plasma treatment, a laser treatment, and a wet chemistry treatment.

10. The method according to claim 1, further comprising:
forming at least partially by galvanically depositing, at least one further electrically conductive pillar directly or indirectly on the at least one electrically conductive pillar.

11. A method of manufacturing a component carrier, the method comprising:
galvanically depositing at least part of at least one electrically conductive pillar on a component;
providing an electrically insulating layer structure, wherein the electrically insulating layer structure is a non-uniform electrically insulating layer structure having at least one protrusion for accommodating the at least one electrically conductive pillar; and
after providing the electrically insulating layer structure, mechanically pressing the at least one electrically conductive pillar and the electrically insulating layer structure into one another, so that the at least one electrically conductive pillar is inserted into the electrically insulating layer structure so deep that a free end of the at least one electrically conductive pillar protrudes beyond the electrically insulating layer structure and is thereby exposed, wherein the inserting comprises one of moving the at least one electrically conductive pillar into the stationary electrically insulating layer structure, and moving the electrically insulating layer structure into the stationary at least one electrically conductive pillar;

the component comprises a semiconductor chip being electrically contacted by a plurality of electrically conductive pillars;

the component comprises the at least one electrically conductive pillar either on only one main surface thereof or on both opposing main surfaces thereof;

after the at least one electrically conductive pillar is inserted into the electrically insulating layer structure, performing at least one further processing step, and subsequently removing the electrically insulating layer structure from the component and the at least one electrically conductive pillar.

\* \* \* \* \*